(12) United States Patent
Chen et al.

(10) Patent No.: US 12,457,751 B2
(45) Date of Patent: Oct. 28, 2025

(54) INTERFACIAL LAYER WITH HIGH TEXTURE UNIFORMITY FOR FERROELECTRIC LAYER ENHANCEMENT

(71) Applicant: Taiwan Semiconductor Manufacturing Company, Ltd., Hsinchu (TW)

(72) Inventors: Tzu-Yu Chen, Kaohsiung (TW); Sheng-Hung Shih, Hsinchu (TW); Fu-Chen Chang, New Taipei (TW); Kuo-Chi Tu, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 802 days.

(21) Appl. No.: 17/572,919

(22) Filed: Jan. 11, 2022

(65) Prior Publication Data
US 2023/0017020 A1    Jan. 19, 2023

Related U.S. Application Data

(60) Provisional application No. 63/223,176, filed on Jul. 19, 2021.

(51) Int. Cl.
*H10B 53/30* (2023.01)
*H01L 23/48* (2006.01)
(Continued)

(52) U.S. Cl.
CPC ........... *H10B 53/30* (2023.02); *H01L 23/481* (2013.01); *H10D 64/689* (2025.01); *H10D 84/80* (2025.01)

(58) Field of Classification Search
CPC ..... H10B 53/30; H01L 23/481; H01L 23/485; H01L 24/47; H10D 84/80; H10D 64/689
See application file for complete search history.

(56) References Cited

U.S. PATENT DOCUMENTS 5,471,363 A * 11/1995 Mihara ............... H10D 1/696
361/321.1
2006/0022236 A1    2/2006 Shin et al.
(Continued)

FOREIGN PATENT DOCUMENTS

CN        113130498 A      7/2021
KR        19980031893    * 7/1996
(Continued)

OTHER PUBLICATIONS

Machine translation of KR19980031893 (Year: 1998).*
(Continued)

*Primary Examiner* — Yasser A Abdelaziz
(74) *Attorney, Agent, or Firm* — Eschweiler & Potashnik, LLC

(57) ABSTRACT

Various embodiments of the present disclosure are directed towards a memory cell in which an interfacial layer is on a bottom of a ferroelectric layer, between a bottom electrode and a ferroelectric layer. The interfacial layer is a different material than the bottom electrode and the ferroelectric layer and has a top surface with high texture uniformity compared to a top surface of the bottom electrode. The interfacial layer may, for example, be a dielectric, metal oxide, or metal that is: (1) amorphous; (2) monocrystalline; (3) crystalline with low grain size variation; (4) crystalline with a high percentage of grains sharing a common orientation; (5) crystalline with a high percentage of grains having a small grain size; or 6) any combination of the foregoing. It has been appreciated that such materials lead to high texture uniformity at the top surface of the interfacial layer.

20 Claims, 22 Drawing Sheets

(51) Int. Cl.
  *H10D 64/68* (2025.01)
  *H10D 84/80* (2025.01)

(56) References Cited

U.S. PATENT DOCUMENTS

| | | | | |
|---|---|---|---|---|
| 2011/0140238 | A1* | 6/2011 | Natori | H10B 53/30 |
| | | | | 257/532 |
| 2019/0074295 | A1 | 3/2019 | Schroeder | |
| 2019/0326357 | A1 | 10/2019 | Castro et al. | |
| 2020/0052191 | A1* | 2/2020 | Ma | H01F 10/3286 |
| 2020/0105772 | A1* | 4/2020 | Chen | H10B 53/30 |
| 2021/0035992 | A1 | 2/2021 | Chen et al. | |
| 2021/0036057 | A1 | 2/2021 | Hsieh et al. | |
| 2021/0091169 | A1 | 3/2021 | Lin et al. | |
| 2021/0202508 | A1 | 7/2021 | Jeon | |
| 2022/0328508 | A1* | 10/2022 | Lin | H10D 1/696 |

FOREIGN PATENT DOCUMENTS

| | | | |
|---|---|---|---|
| KR | 19980031893 | A | 7/1998 |
| KR | 20190117507 | A | 10/2019 |

OTHER PUBLICATIONS

U.S. Appl. No. 16/780,418, filed Feb. 3, 2020.
AZO Optics. "Recognizing Surface Texture Parameters" Published on Apr. 17, 2017. Retrieved from https://www.azooptics.com/Article.aspx?ArticleID=1214.
ScienceDirect "Surface Texture" Mechatronics and Manufacturing Engineering, published in 2012.
Wikipedia.org "Surface Finish" Published on Jul. 2, 2021.
Chen et al. "Significant improvement of ferroelectricity and reliability in Hf0.5Zr0.5O2 films by inserting an ultrathin Al2O3 buffer layer" Applied Surface Science 542 (2021) 148737, published on Dec. 11, 2020.

* cited by examiner

INTERFACIAL LAYER WITH HIGH TEXTURE UNIFORMITY FOR FERROELECTRIC LAYER ENHANCEMENT

REFERENCE TO RELATED APPLICATION

This application claims the benefit of U.S. Provisional Application No. 63/223,176, filed on Jul. 19, 2021, the contents of which are incorporated by reference in their entirety.

BACKGROUND

Many modern-day electronic devices include non-volatile memory. Non-volatile memory is electronic memory that is able to store data in the absence of power. Promising candidates for the next generation of non-volatile memory include ferroelectric random-access memory (FeRAM). FeRAM has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
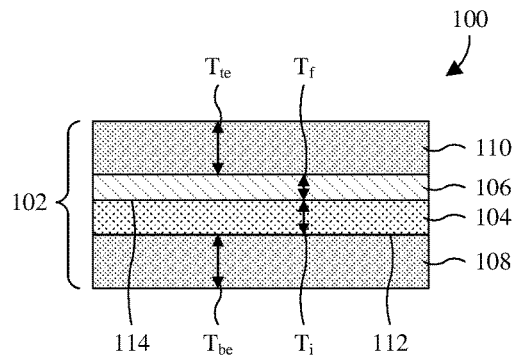
FIG. 1 illustrates a cross-sectional view of some embodiments of a memory cell in which an interfacial layer with high texture uniformity is on a bottom of a ferroelectric layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit (IC) chip may comprise a memory cell in an interconnect structure of the IC chip. The memory cell may comprise a bottom electrode, a ferroelectric layer overlying the bottom electrode, and a top electrode overlying the ferroelectric layer. The interconnect structure may comprise a bottom electrode wire underlying the memory cell, a top electrode wire overlying the memory cell, and vias extends respectively from the bottom and top electrode wires respectively to the bottom and top electrodes.

A challenge with the memory cell is that a top surface of the bottom electrode may have low texture uniformity. Because the ferroelectric layer is formed on the top surface of the bottom electrode, the low texture uniformity may lead to a high degree of variation with, and degradation of, properties of the ferroelectric layer. For example, remanent polarization may have a high degree of variation, whereby bulk manufacturing yields may be low. As another example, remanent polarization may be degraded, whereby read operations may be prone to failure. Further, a memory cell having a small footprint may have lower texture uniformity than a like memory cell having a large footprint. A small footprint may, for example, be a footprint spanning an area of less than or equal to about 0.25 squared micrometers or some other suitable value. Therefore, with the downsizing of electronic devices and hence memory cells becoming smaller and smaller, the low texture uniformity may become more and more of a challenge.

Various embodiments of the present disclosure are directed towards a memory cell in which an interfacial layer is on a bottom of a ferroelectric layer, between a bottom electrode and a ferroelectric layer. The interfacial layer is a different material than the bottom electrode and the ferroelectric layer and has a top surface with high texture uniformity compared to a top surface of the bottom electrode. The interfacial layer may, for example, be a dielectric, metal oxide, or metal that is: (1) amorphous; (2) monocrystalline; (3) crystalline with low grain size variation; (4) crystalline with a high percentage of grains sharing a common orientation; (5) crystalline with a high percentage of grains having a small grain size; or 6) any combination of the foregoing. It has been appreciated that such materials lead to high texture uniformity at the top surface of the interfacial layer. Notwithstanding the foregoing materials enumerated above for the interfacial layer, other suitable materials are amenable.

Because the interfacial layer may be a dielectric, metal oxide, or metal that is amorphous or crystalline, the interfacial layer may be integrated into embedded memory structures and processes without concern for the interfacial layer causing deleterious contamination. Because the ferroelectric layer is formed on the top surface of the bottom electrode, and because the top surface has high texture uniformity, properties of the ferroelectric layer may be enhanced and/or may have high uniformity. For example, remanent polarization may have a high uniformity, whereby bulk manufacturing yields may be low. As another example, remanent polarization may be enhanced, whereby read operations may be less prone to failure. Further, the high uniformity may enable increased scaling down of the memory cell.

With reference to FIG. 1, a cross-sectional view 100 of some embodiments of a memory cell 102 is provided in which an interfacial layer 104 with high texture uniformity is on a bottom of a ferroelectric layer 106. The memory cell 102 may, for example, be a metal-ferroelectric-metal (MFM) cell, a ferroelectric capacitor, a ferroelectric tunnel junction (FTJ), some other structure suitable for data storage, or any combination of the foregoing.

The interfacial layer 104 overlies a bottom electrode 108, the ferroelectric layer 106 overlies the interfacial layer 104, and a top electrode 110 overlies the ferroelectric layer 106. The interfacial layer 104 is a different material than the ferroelectric layer 106 and the bottom electrode 108, and directly contacts the bottom electrode 108 at a top surface 112 of the bottom electrode 108. The ferroelectric layer 106 has a remanent polarization and directly contacts the interfacial layer 104 at a top surface 114 of the interfacial layer 104.

The top surfaces 112, 114 of the bottom electrode 108 and the interfacial layer 104 respectively and comparatively have low texture uniformity and high texture uniformity. In other words, compared to the top surface 112 of the bottom electrode 108, the top surface 114 of the interfacial layer 104 has higher texture uniformity. Texture, may, for example, correspond to deviation of a surface from a perfectly flat plain in terms of lay, roughness, waviness, other suitable parameter(s), or any combination of the foregoing.

It has been appreciated that forming the ferroelectric layer 106 on a surface having high texture uniformity instead of low texture uniformity enhances, and/or increases uniformity of, properties of the ferroelectric layer 106. Non-limiting examples of such properties include remanent polarization, crystalline quality, surface roughness, texture, other suitable properties, or any combination of the foregoing. Therefore, because the ferroelectric layer 106 is formed on the top surface 114 of the interfacial layer 104 instead of on the top surface 112 of the bottom electrode 108, properties of the ferroelectric layer 106 may be enhanced and/or may have high uniformity. For example, remanent polarization of the ferroelectric layer 106 may have high uniformity, whereby bulk manufacturing yields may be low. As another example, remanent polarization of the ferroelectric layer 106 may be enhanced (e.g., increased), whereby read operations may be less prone to failure. If the interfacial layer 104 were omitted and the ferroelectric layer 106 was formed on the top surface 112 of the bottom electrode 108, properties of the ferroelectric layer 106 may be degraded and/or may have low uniformity.

In some embodiments, the memory cell 102 is formed in bulk across a wafer and/or a lot of wafers. Further, remanent polarization or some other suitable property of the ferroelectric layer 106 is measured at multiple instances of the memory cell 102 spread across the wafer and/or the lot of wafers. In at least some of such embodiments, the measurements have low variation (e.g., high uniformity) because of the high texture uniformity at the top surface 114 of the interfacial layer 104. Variation may, for example, be determined as (MAX-MIN)/(2×AVG)*100, where MAX corresponds to the maximum measurement, MIN corresponds to the minimum measurement, and AVG corresponds to the average of the measurements. Low variation may, for example, be variation less than about 10%, 5%, or some other suitable value.

Because properties of the ferroelectric layer 106 may be enhanced and/or may have high uniformity, the memory cell 102 may be scaled down more than would otherwise be possible. For example, the memory cell 102 may be scaled down so a footprint of the ferroelectric layer 106 has a small area less than about 0.25 squared micrometers or some other suitable value. The footprint may, for example, correspond to a two-dimensional (2D) projection of the ferroelectric layer 106 onto the top surface 112 of the bottom electrode 108. In some embodiments, the 2D projection has a same area as a top surface of the ferroelectric layer 106 and/or as a bottom surface of the ferroelectric layer 106.

As noted above, texture may, for example, correspond to deviation of a surface from a perfectly flat plain in terms of lay, roughness, waviness, other suitable parameter(s), or any combination of the foregoing. Lay may, for example, refer to direction of the predominant surface pattern. Roughness may, for example, refer to a measure of spaced irregularities of the surface. Waviness parameters may, for example, refer to a measure of spaced irregularities of the surface on which roughness is overlaid. Compared to the irregularities of the roughness, the irregularities of waviness are larger and have a greater spacing.

In some embodiments, texture at the top surfaces 112, 114 respectively of the bottom electrode 108 and the interfacial layer 104 is measured using interferometry, atomic force microscopy (AFP), some other suitable methodology, or any combination of the foregoing and/or is measured using a profilometer or some other suitable tool. In some embodiments, texture at the top surface 112 of the bottom electrode 108 is measured as above before the interfacial layer 104 is formed, and/or texture at the top surface 114 of the interfacial layer 104 is measured as above before the ferroelectric layer 106 is formed.

In some embodiments, texture at the top surfaces 112, 114 respectively of the bottom electrode 108 and the interfacial layer 104 is quantified by one, two, three, or more texture parameters. Such texture parameters may, for example, include arithmetic mean deviation/average roughness (e.g., Ra), root mean squared roughness (e.g., Rq), average waviness (e.g., Wa), total waviness (e.g., Wt), waviness spacing (e.g., Wsm), some other suitable parameter(s), or any combination of the foregoing. To the extent that texture is quantified using multiple texture parameters, the texture parameters may be combined into a single quantity by an average function, a weighted average function, or some other suitable function.

In some embodiments, variation for a set of measurements is a percentage determined as (MAX-MIN)/(2×AVG)*100, where MAX corresponds to the maximum measurement, MIN corresponds to the minimum measurement, and AVG corresponds to the average of the measurements. Further, in some embodiments, uniformity for the set of measurements is a percentage determined as 100-VARIATION, where VARIATION is determined as above. For example, if VARIATION is 5%, uniformity may be 95%. Therefore, in some embodiments, texture variation and/or uniformity of a surface (e.g., the top surface 112 of the bottom electrode or the top surface 114 of the interfacial layer 104) may be determined as above from a set of measurements quantifying texture of the surface.

In some embodiments, texture variation or uniformity at the top surface 112 of the bottom electrode 108 and texture variation or uniformity at the top surface 114 of the interfacial layer 104 are each determined as above from a set of measurements determined by measuring texture at multiple different locations spread across the top surface 112, 114. In some embodiments, the memory cell 102 is formed in bulk across a wafer and/or a lot of wafers. Further, texture variation or uniformity at the top surface 112 of the bottom electrode 108 and texture variation or uniformity at the top surface 114 are each determined as above from a set of measurements determined by measuring texture of the top surface 112, 114 at multiple instances of the memory cell 102 spread across the wafer and/or the lot of wafers.

In some embodiments, texture at the top surfaces 112, 114 respectively of the bottom electrode 108 and the interfacial layer 104 is quantified using average roughness (e.g., Ra). For example, a first set of average roughness measurements may be measured at multiple locations evenly spread across the top surface 112 of the bottom electrode 108, and a second set of average roughness measurements may be measured at multiple locations evenly spread across the top surface 114 of the interfacial layer 104. In some embodiments, because of the high texture uniformity at the top surface 114 of the interfacial layer 104, an average of the second set of measurements may be less than an average of the first set of measurements. Further, variation of the second set of measurements may be less than that of the first set of measurements. Put another way, uniformity of the second set may be more than that of the first set.

In some embodiments, the interfacial layer 104 is or comprises: (1) an amorphous dielectric; (2) an amorphous metal oxide; (3) an amorphous metal; (4) some other suitable material(s); or (5) or any combination of the foregoing. The amorphous metal may, for example, be limited to or consist essentially of one or more metal elements. The amorphous dielectric may, or may not, be or comprise a metal oxide and may, or may not, comprise oxide. It has been appreciated that amorphousness of the interfacial layer 104 may lead to high texture uniformity at the top surface 114 of the interfacial layer 104.

In other embodiments, the interfacial layer 104 is or comprises: (1) a crystalline dielectric; (2) a crystalline metal oxide; (3) a crystalline metal; (4) some other suitable material(s); or (5) or any combination of the foregoing. The crystalline metal may, for example, be limited to or consist essentially of one or more metal elements. The crystalline dielectric may, or may not, be or comprise a metal oxide and may, or may not, comprise oxide.

In some embodiments in which the interfacial layer 104 is a crystalline dielectric, crystalline metal oxide, or crystalline metal, the interfacial layer: (1) is monocrystalline; (2) has low grain size variation; (3) has a high percentage of grains sharing a common orientation; (4) has a high percentage of grains having a small grain size; or (5) is/has any combination of the foregoing. It has been appreciated that such crystalline properties may lead to high texture uniformity at the top surface 114 of the interfacial layer 104. In at least some embodiments, properties (1) to (4) are ordered from most effective to least effect at increasing texture uniformity.

Grain size variation may, for example, be determined as (MAX-MIN)/(2×AVG)*100, where MAX corresponds to the maximum grain size, MIN corresponds to the minimum grain size, and AVG corresponds to the average grain size. The low grain size variation at (2) may, for example, be grain size variation less than about 10%, about 5%, or some other suitable value. The high percentage at (3) and/or (4) may, for example, be a majority of grains and/or may, for example, be a percentage greater than about 90%, about 95%, or some other suitable value. The common orientation at (3) may, for example, be represented using the Miller index or some other suitable notation system and/or may, for example, be measured by x-ray diffraction analysis (XRD) or by some other suitable methodology. Further, the common orientation at (3) may, for example, be a most common or majority grain orientation. In some embodiments in which the interfacial layer 104 is crystalline titanium nitride, more than about 90% of grains may share an orientation of (111). The small grain size at (4) may, for example, correspond to average grain size, maximum grain size, median grain size, or the like less than or equal to about 1 nanometer, 0.5 nanometers, or some other suitable value.

Because the interfacial layer 104 may be a dielectric, metal oxide, or metal, the interfacial layer 104 may be integrated into embedded memory structures and processes without concern for the interfacial layer 104 causing deleterious contamination of process tools and/or structure surrounding the interfacial layer 104.

In some embodiments in which the interfacial layer 104 is or comprises a crystalline dielectric or crystalline metal oxide, the crystalline dielectric or crystalline metal oxide has a crystallization temperature above about 400 degrees Celsius, about 700 degrees Celsius, about 1000 degrees Celsius, or some other suitable value. For example, the crystalline dielectric or crystalline metal oxide may be or comprise aluminum oxide (e.g., $Al_2O_3$), silicon oxide (e.g., $SiO_2$), ruthenium oxide (e.g., RuO), some other suitable material, or any combination of the foregoing.

In some embodiments in which the interfacial layer 104 is or comprises a dielectric or metal oxide, regardless of whether amorphous or crystalline, the interfacial layer 104 has a high energy band gap. Such a high energy band gap may, for example, be a band gap greater than that of the ferroelectric layer 106. For example, the ferroelectric layer 106 may, for example, be or comprise hafnium zirconium oxide (e.g., HZO), whereas the interfacial layer 104 may be or comprise aluminum oxide (e.g., $Al_2O_3$). Other suitable materials are, however, amenable. The high energy band gap at the interfacial layer 104 may reduce leakage current.

In some embodiments, a thickness $T_i$ of the interfacial layer 104 is greater than 0 and is about 5-100 angstroms, about 5-50 angstroms, about 50-100 angstroms, or some other suitable value. To the extent that the thickness $T_i$ is less than about 50 angstroms and the interfacial layer 104 is crystalline, an average grain size of the interfacial layer 104 is generally less than about 5 angstroms (e.g., 0.5 nanometers) regardless of material.

In some embodiments, the ferroelectric layer 106 is or comprises a binary oxide, a ternary oxide or nitride, a quaternary oxide, some other suitable ferroelectric material(s), or any combination of the foregoing. The binary oxide may, for example, be or comprise hafnium oxide (e.g., hafnia or $HfO_2$) and/or some other suitable binary oxide(s). The ternary oxide or nitride may, for example, be or comprise hafnium silicate (e.g., $HfSiO_x$), hafnium zirconate (e.g., $HfZrO_x$), barium titanate (e.g., $BaTiO_3$), lead titanate (e.g., $PbTiO_3$), strontium titanate (e.g., $SrTiO_3$), calcium manganite (e.g., $CaMnO_3$), bismuth ferrite (e.g., $BiFeO_3$), aluminum scandium nitride (e.g., AlScN), aluminum gallium nitride (e.g., AlGaN), aluminum yttrium nitride (e.g., AlYN), some other suitable ternary oxide(s) and/or nitride(s), or any combination of the foregoing. The quaternary oxide may, for example, be or comprise barium strontium titanate (e.g., $BaSrTiO_x$) and/or some other suitable quaternary oxide(s).

In some embodiments, a thickness $T_f$ of the ferroelectric layer 106 is about 50-200 angstroms, about 50-125 angstroms, about 125-200 angstroms, or some other suitable value. For example, the thickness $T_f$ may be about 120 angstroms or some other suitable value. If the thickness $T_f$ is too small (e.g., less than about 50 angstroms or some other suitable value) or is too large (e.g., greater than about 200 angstroms or some other suitable value), the ferroelectric layer 106 may have no ferroelectric response or an unusably small ferroelectric response. In other words, if the thickness $T_f$ is too small or large, the ferroelectric layer 106 may have no remanent polarization or may have an unusably small remanent polarization.

In some embodiments, the bottom electrode 108 and/or the top electrode 110 is/are or comprise(s) titanium nitride (e.g., TiN), tantalum nitride (e.g., TaN), ruthenium (e.g., Ru), platinum (e.g., Pt), iridium (e.g., Jr), molybdenum (e.g., Mo), tungsten (e.g., W), doped polysilicon, some other suitable conductive material(s), or any combination of the foregoing. In some embodiments, the bottom electrode 108 is a same material as the top electrode 110. In other embodiments, the bottom electrode 108 is a different material than the top electrode 110.

In some embodiments, the bottom electrode 108 is crystalline. Further, in at least some embodiments in which the bottom electrode 108 is crystalline, the bottom electrode 108: (1) is polycrystalline; (2) has high grain size variation; (3) has a low percentage of grains sharing a common orientation; (4) has a low percentage of grains having a small grain size; or 5) is/has any combination of the foregoing. It has been appreciated that such crystalline properties may lead to low texture uniformity at the top surface 112 of the bottom electrode 108. The high grain size variation at (2) may, for example, be grain size variation greater than that of the interfacial layer 104 and/or greater than about 10%, about 20%, about 50%, or some other suitable value. The common orientation at (3) may, for example, be a most common or majority grain orientation. The low percentage at (3) may, for example, be a percentage less than that of the interfacial layer 104 and/or less than about 10%, about 5%, or some other suitable value. Similarly, the low percentage at (4) may, for example, be a percentage less than that of the interfacial layer 104 and/or less than about 10%, about 5%, or some other suitable value. Grain size variation and small grain size are as described above with regard to the interfacial layer 104.

In some embodiments, a thickness $T_{be}$ of the bottom electrode 108 is about 50-200 angstroms, about 50-125 angstroms, about 125-200 angstroms, or some other suitable value. If the thickness $T_{be}$ is too thin (e.g., less than about 50 angstroms or some other suitable value), a resistance of the bottom electrode 108 may be too high. The high resistance may lead to poor power efficiency and/or may prevent operation of the memory cell 102 at standard voltages.

In some embodiments, a ratio of the thickness $T_{be}$ of the bottom electrode 108 to the thickness $T_i$ of the interfacial layer 104 is about 0.5-40, about 0.5-20, about 20-40, or some other suitable value. In some embodiments, a sum of the thickness $T_{be}$ of the bottom electrode 108 and the thickness $T_i$ of the interfacial layer 104 is about 55-300 angstroms, about 55-180 angstroms, about 180-300 angstroms, or some other suitable value. If the sum is too large (e.g., more than about 300 angstroms or some other suitable value), a height of the memory cell 102 may be too large. This may cause processing challenges during formation of the memory cell 102 and/or when integrating the memory cell 102 with embedded memory process flows.

In some embodiments, a thickness $T_{te}$ of the top electrode 110 is about 100-300 angstroms, about 100-200 angstroms, about 200-300 angstroms, or some other suitable value. If the thickness $T_{te}$ of the top electrode 110 is too large (e.g., more than about 300 angstroms or some other suitable value), a height of the memory cell 102 may be too large.

During operation of the memory cell 102, the remanent polarization of the ferroelectric layer 106 is used to represent a bit of data. For example, a positive polarity of the remanent polarization may represent a binary "0", whereas a negative polarity of the remanent polarization may represent a binary "1", or vice versa.

To set the remanent polarization to the positive polarity, a first write voltage is applied across the ferroelectric layer 106 from the top electrode 110 to the bottom electrode 108. To set the remanent polarization to the negative polarity, a second write voltage is applied across the ferroelectric layer 106 from the top electrode 110 to the bottom electrode 108. The first and second write voltages have opposite polarities and have magnitudes in excess of the coercive voltage. In some embodiments, to read the polarity of the remanent polarization, the remanent polarization is set to the positive or negative polarity as above. If the polarity of the remanent polarization changes, a current pulse occurs. Otherwise, no current pulse occurs. Hence, the current pulse may be used to identify the polarity of the remanent polarization.

Figure 2A:
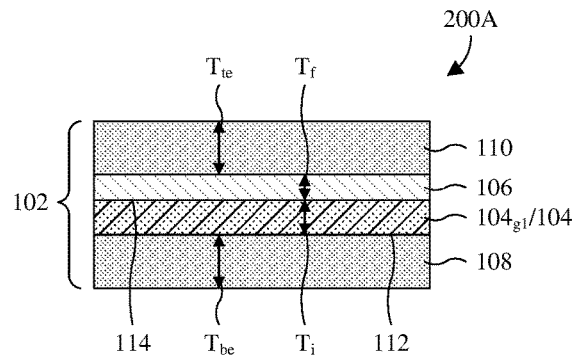
FIGS. 2A and 2B illustrate cross-sectional views of some embodiments of the memory cell of FIG. 1 in which material type of the interfacial layer is varied.
Figure 2B:
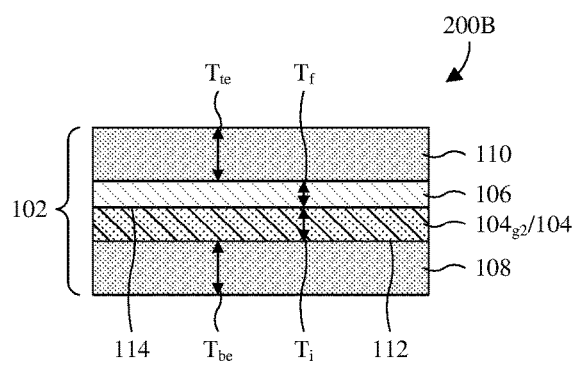

With reference to FIGS. 2A and 2B, cross-sectional views 200A, 200B of some embodiments of the memory cell 102 of FIG. 1 are provided in which the interfacial layer 104 is respectively a group 1 material and a group 2 material. In other words, the interfacial layer 104 is a group 1 interfacial layer $104_{g1}$ in FIG. 2A and a group 2 interfacial layer $104_{g2}$ in FIG. 2B.

A group 1 material is a dielectric or metal oxide that is amorphous or crystalline as described with regard to FIG. 1. The dielectric may, or may not, be or comprise a metal oxide and may, or may not, comprise oxide. In some embodiments, the metal oxide is conductive. For example, the metal oxide may be conductive in embodiments in which the metal oxide is or comprise ruthenium oxide (e.g., RuOx), iridium oxide (e.g., IrOx), or some other suitable material. In other embodiments, the metal oxide is dielectric.

A group 2 material is conductive and is a metal that is amorphous or crystalline as described with regard to FIG. 1. The metal is conductive and may, for example, be limited to or consist essentially of one or more metal elements.

Figure 3:
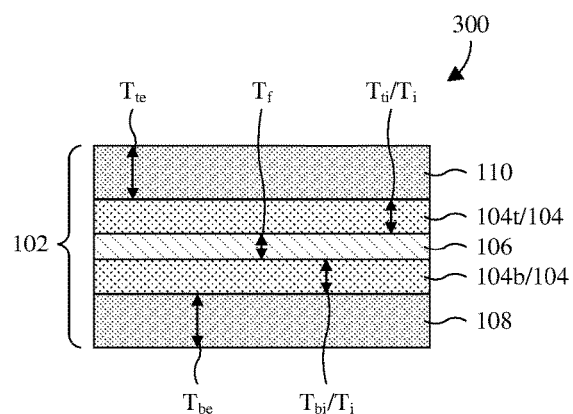
FIG. 3 illustrates a cross-sectional view of some alternative embodiments of the memory cell of FIG. 1 in which an additional interfacial layer is on a top of the ferroelectric layer.

With reference to FIG. 3, a cross-sectional view 300 of some alternative embodiments of the memory cell 102 of FIG. 1 is provided in which the memory cell 102 comprises an additional interfacial layer 104. The additional interfacial layer 104 borders the top electrode 110, between the top electrode 110 and the ferroelectric layer 106, and may therefore be referred to as a top interfacial layer 104t. Further, the interfacial layer 104 from FIG. 1 borders the bottom electrode 108, between the bottom electrode 108 and the ferroelectric layer 106, and may therefore be referred to as the bottom interfacial layer 104b.

The bottom and top interfacial layers 104b, 104t are each as the interfacial layer 104 of FIG. 1 is described. In some embodiments, the bottom and top interfacial layers 104b, 104t are the same material. In other embodiments, the bottom and top interfacial layers 104b, 104t are different materials. Further, the bottom and top interfacial layers 104b, 104t respectively have a bottom interfacial thickness $T_{bi}$ and a top interfacial thickness $T_{ti}$, which are each as the interfacial thickness $T_i$ of FIG. 1 is described.

In some embodiments, a ratio of the thickness $T_{te}$ of the top electrode 110 to the top interfacial thickness $T_{ti}$ is about 1-60, about 1-30, about 30-60, or some other suitable value. In some embodiments, a sum of the thickness $T_{te}$ of the top electrode 110 and the top interfacial thickness $T_{ti}$ is about 105-400 angstroms, about 105-250 angstroms, about 250-400 angstroms, or some other suitable value. If the sum is too thin (e.g., less than about 105 angstroms or some other suitable value), etching to form a top electrode via (TEVA) on the top electrode 110 may over etch to the ferroelectric layer 106. The over etching may, for example, increase process tool contamination and/or material of the TEVA may contaminate the ferroelectric layer 106. Additionally, the over etching may, for example, result in high resistance from the top electrode 110 to the TEVA because of a small contact area. If the sum is too thick (e.g., greater than about 400 angstroms or some other suitable value), a height of the memory cell 102 may be too large. As above, this may cause processing challenges during formation of the memory cell 102 and/or when integrating the memory cell 102 with embedded memory process flows.

In some embodiments in which the bottom interfacial layer 104b is or comprises a dielectric or metal oxide, regardless of whether amorphous or crystalline, the bottom interfacial layer 104b has a high energy band gap. Similarly, in some embodiments in which the top interfacial layer 104t is or comprises a dielectric or metal oxide, regardless of whether amorphous or crystalline, the top interfacial layer 104t has a high energy band gap. A high energy band gap may, for example, be a band gap greater than that of the ferroelectric layer 106. The high energy band gap at the bottom interfacial layer 104b and/or the high energy band gap at the top interfacial layer 104t may reduce leakage current.

With reference to FIGS. 4A-4D, cross-sectional views 400A-400D of some embodiments of the memory cell 102 of FIG. 3 are provided in which the bottom and top interfacial layers 104b, 104t are varied between group 1 materials and group 2 materials. A group 1 material is a dielectric or metal oxide that is amorphous or crystalline as described with regard to FIG. 1, whereas a group 2 material is conductive and is a metal that is amorphous or crystalline as described with regard to FIG. 1.

Figure 4A:
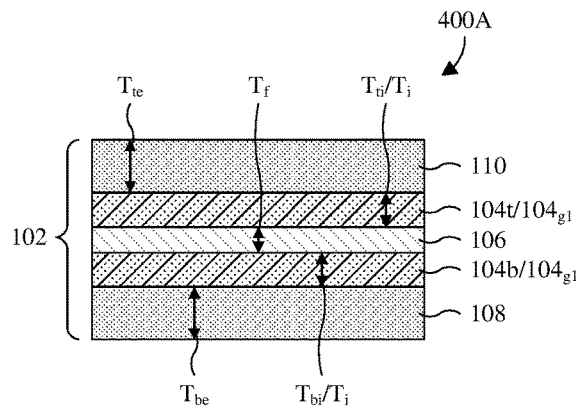
FIGS. 4A-4D illustrate cross-sectional views of some embodiments of the memory cell of FIG. 3 in which material types of the interfacial layers are varied.
Figure 4B:
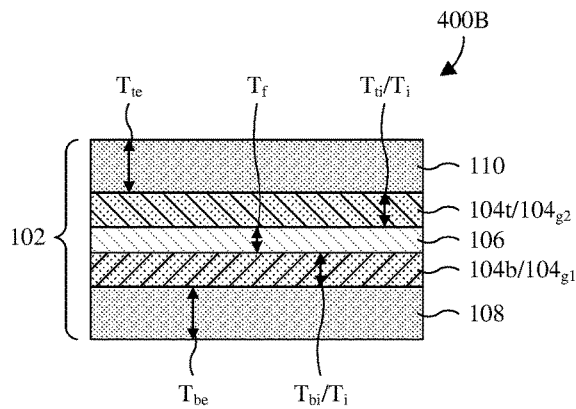
Figure 4C:
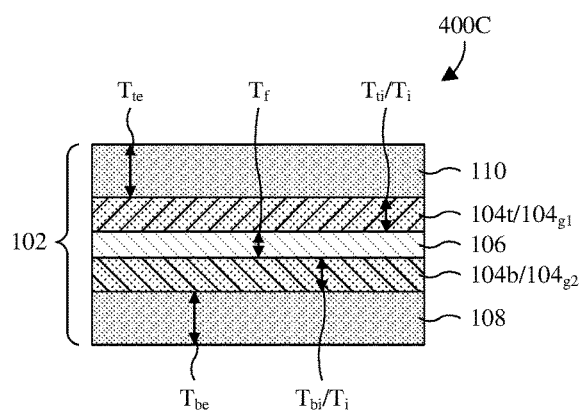
Figure 4D:
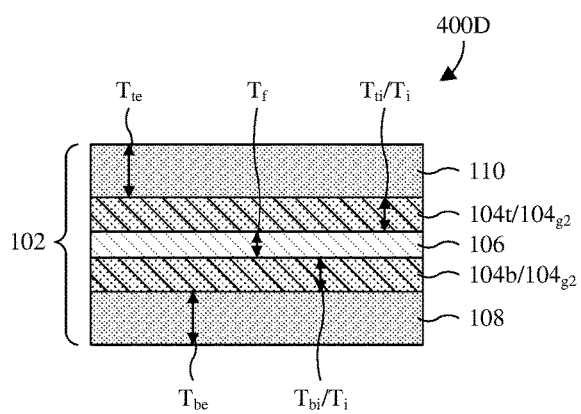

In FIG. 4A, the bottom and top interfacial layers 104b, 104t are group 1 materials and are therefore both group 1 interfacial layers $104_{g1}$. In FIG. 4B, the bottom and top interfacial layers 104b, 104t are respectively a group 1 material and a group 2 material and are therefore respectively a group 1 interfacial layer $104_{g1}$ and a group 2 interfacial layer $104_{g2}$. In FIG. 4C, the bottom and top interfacial layers 104b, 104t are respectively a group 2 material and a group 1 material and are therefore respectively a group 2 interfacial layer $104_{g2}$ and a group 1 interfacial layer $104_{g1}$. In FIG. 4D, the bottom and top interfacial layers 104b, 104t are group 2 materials and are therefore both group 2 interfacial layers $104_{g2}$.

Figure 5:
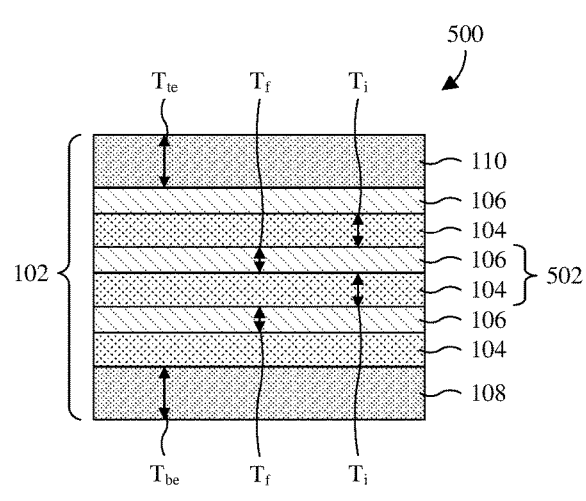
FIG. 5 illustrates a cross-sectional view of some alternative embodiments of the memory cell of FIG. 1 in which interfacial layers with high texture uniformity are alternatingly stacked with ferroelectric layers.

With reference to FIG. 5, a cross-sectional view 500 of some alternative embodiments of the memory cell 102 of FIG. 1 is provided in which the memory cell 102 comprises a plurality of interfacial layers 104 and a plurality of ferroelectric layers 106. The interfacial layers 104 are alternatingly stacked with the ferroelectric layers 106 from the bottom electrode 108 to the top electrode 110. Further, the interfacial layers 104 are paired with the ferroelectric layers 106 to form a plurality of interfacial-ferroelectric pairs 502. The interfacial layer 104 of each interfacial-ferroelectric pair 502 underlies the ferroelectric layer 106 of the interfacial-ferroelectric pair 502 to enhance uniformity of the ferroelectric layer 106 as described with regard to FIG. 1. In alternative embodiments, the memory cell 102 includes more or less interfacial-ferroelectric pairs 502.

Generally, the larger a remanent polarization of a ferroelectric layer is, the better. The remanent polarization may be increased by increasing thickness of the ferroelectric layer. However, the orthorhombic phase is responsible for the remanent polarization. Further, above a certain thickness, a ratio of the orthorhombic phase to other phases decreases. Therefore, the ability to increase remanent polarization by thickness is limited. By alternatingly stacking the plurality of interfacial layers 104 with the plurality of ferroelectric layers 106, this thickness limitation may be overcome and increased remanent polarization may be achieved.

Figure 6:
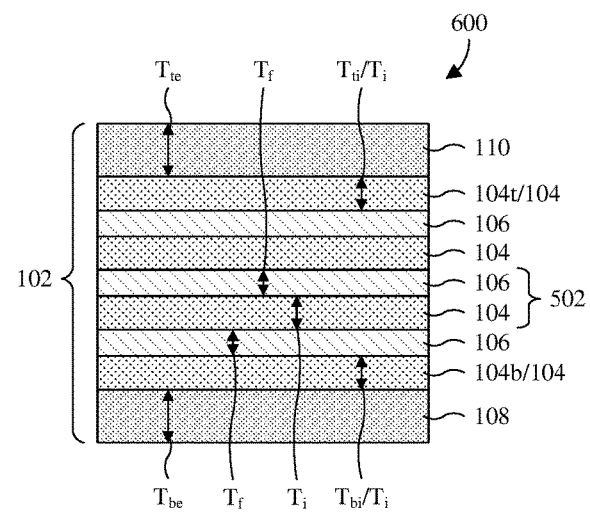
FIG. 6 illustrates a cross-sectional view of some alternative embodiments of the memory cell of FIG. 5 in which an additional interfacial layer is on a top of a topmost ferroelectric layer amongst the ferroelectric layers.

With reference to FIG. 6, a cross-sectional view 600 of some alternative embodiments of the memory cell 102 of FIG. 5 is provided in which an additional interfacial layer 104 is on a top of a topmost ferroelectric layer amongst the ferroelectric layers 106. The additional interfacial layer 104 borders the top electrode 110 and may therefore be referred to as a top interfacial layer 104t. Similarly, an interfacial layer bordering the bottom electrode 108 may be referred to as a bottom interfacial layer 104b.

While FIGS. 5 and 6 do not illustrate the interfacial layers 104 as group 1 and/or 2 materials, it should be appreciated that the interfacial layers 104 may be group 1 and/or 2 materials. In some embodiments, the interfacial layers 104 of FIG. 5 are a group 1 or 2 material. In some embodiments, the top interfacial layer 104t of FIG. 6 is a group 1 material, whereas remaining interfacial layers 104 of FIG. 6 are a group 1 or 2 material. In alternative embodiments, the top interfacial layer 104t of FIG. 6 is a group 2 material, whereas remaining interfacial layers 104 of FIG. 6 are a group 1 or 2 material. In alternative embodiments, the interfacial layers 104 of FIG. 5 or 6 alternate periodically between a group 1 material and a group 2 material, or vice versa, from the bottom electrode 108 to the top electrode 110.

Figure 7A:
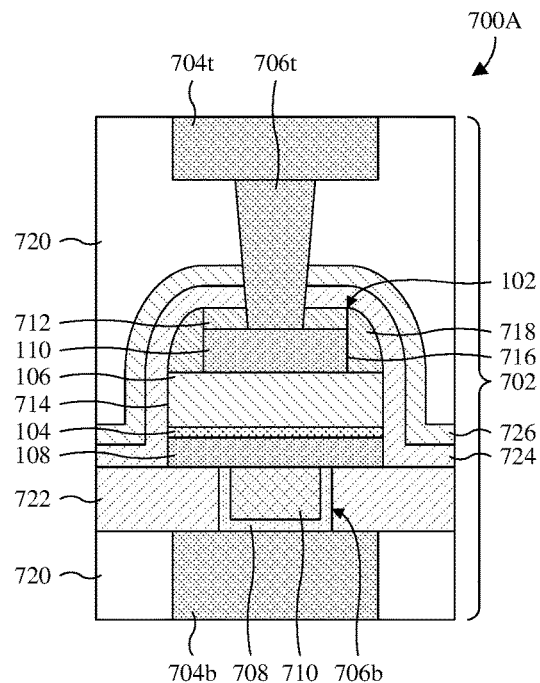
FIGS. 7A and 7B illustrate various views of some embodiments of the memory cell of FIG. 1 in which the memory cell is integrated into an interconnect structure of an integrated circuit (IC) chip.

With reference to FIG. 7A, a cross-sectional view 700A of some embodiments of the memory cell 102 of FIG. 1 is provided in which the memory cell 102 is integrated into an interconnect structure 702 of an IC chip.

A top electrode wire 704t overlies the memory cell 102, and a top electrode via (TEVA) 706t extends downward from the top electrode wire 704t to the top electrode 110. A bottom electrode wire 704b underlies the memory cell 102, and a bottom electrode via (BEVA) 706b extends upward from the bottom electrode wire 704b to the bottom electrode 108. The BEVA 706b comprises a BEVA barrier 708 and a BEVA body 710. The BEVA barrier 708 cups an underside of the BEVA body 710 to separate the BEVA body 710 from the bottom electrode wire 704b. In alternative embodiments, the BEVA barrier 708 is omitted, such that the BEVA body 710 directly contacts the bottom electrode wire 704b. The BEVA barrier 708 may, for example, be configured to block or otherwise substantially decrease diffusion of material from the bottom electrode wire 704b to the bottom electrode 108.

In some embodiments, the top electrode wire 704t, the TEVA 706t, and the bottom electrode wire 704b are or comprise copper, aluminum, tungsten, some other suitable metal(s), or any combination of the foregoing. In some embodiments, the BEVA body 710 is or comprises: (1) a same material as the top electrode wire 704t, the TEVA 706t, the bottom electrode wire 704b, or any combination of the foregoing; (2) a same material as the BEVA barrier 708; (3) a same material as the bottom electrode 108; (4) some other suitable material(s); or (5) any combination of the foregoing. In some embodiments, the BEVA barrier 708 is or comprises titanium nitride, platinum, aluminum copper, gold, titanium, tantalum, tantalum nitride, tungsten, tungsten nitride, some other suitable material(s), or any combination of the foregoing. In some embodiments, a thickness of the BEVA barrier 708 is about 50-200 angstroms or some other suitable value.

A hard mask 712 overlies the top electrode 110, and the TEVA 706t extends through the hard mask 712 from the top electrode wire 704t to the top electrode 110. In alternative embodiments, the hard mask 712 is omitted. The hard mask 712 may, for example, be or comprise titanium nitride, silicon oxide, silicon nitride, silicon carbide nitride, silicon oxide nitride, metal oxide, some other suitable material(s), or any combination of the foregoing. The metal oxide may, for example, be or comprise titanium oxide, aluminum oxide, some other suitable metal oxide(s), or any combination of the foregoing. In some embodiments, a thickness of the hard mask 712 is about 50-400 angstroms or some other suitable value.

As described with regard to FIG. 1, the interfacial layer 104 is configured to enhance, and/or increase uniformity of, properties of the ferroelectric layer 106. For example, the interfacial layer 104 may enhance (e.g., increase) remanent polarization of the ferroelectric layer 106 and increase uniformity of the remanent polarization. In some embodiments, the interfacial layer 104 is a group 1 material as described with regard to FIG. 2A. In other embodiments, the interfacial layer 104 is a group 2 material as described with regard to FIG. 2B.

The bottom electrode 108, the interfacial layer 104, and the ferroelectric layer 106 share a first common width and form a pair of first common sidewalls 714 respectively on opposite sides of the memory cell 102. Further, the top electrode 110 and the hard mask 712 share a second common width and form a pair of second common sidewalls 716 respectively on the opposite sides of the memory cell 102. The second common width is less than the first common width, and the second common sidewalls 716 are laterally between the first common sidewalls 714. The first and second common sidewalls 714, 716 have planar profiles but may alternatively have curved profiles or other suitable profiles.

A sidewall spacer structure 718 overlies the ferroelectric layer 106 and is on the second common sidewalls 716. The sidewall spacer structure 718 may, for example, be or comprise titanium nitride, silicon oxide, silicon nitride, silicon carbide nitride, silicon oxide nitride, metal oxide, some other suitable material(s), or any combination of the foregoing. The metal oxide may, for example, be or comprise titanium oxide, aluminum oxide, some other suitable metal oxide(s), or any combination of the foregoing. In some embodiments, the sidewall spacer structure 718 is a same material as the hard mask 712.

A plurality of intermetal dielectric (IMD) layers 720 respectively surround the bottom electrode wire 704b and the top electrode wire 704t. Further, a first etch stop layer 722, a second etch stop layer 724, and a buffer layer 726 separate the IMD layers 720. The first etch stop layer 722 surrounds the BEVA 706b, vertically between the bottom electrode wire 704b and the memory cell 102. The second etch stop layer 724 and the buffer layer 726 cover and conform to the first etch stop layer 722 and the memory cell 102. Further, the second etch stop layer 724 is between the buffer layer 726 and the memory cell 102.

The IMD layers 720 may, for example, be or comprise silicon oxide, silicon nitride, silicon carbide, silicon oxycarbide, silicon oxynitride, silicon carbonitride, some other suitable dielectric(s), or any combination of the foregoing. The first etch stop layer 722 and/or the second etch stop layer 724 may, for example, be or comprise metal nitride, metal oxide, metal carbide, silicon nitride, silicon oxide, silicon carbide, silicon oxynitride, some other suitable dielectric(s), or any combination of the foregoing. In some embodiments, the first etch stop layer 722 and the second etch stop layer 724 are a same material. In some embodiments, a thickness of the first etch stop layer 722 is about 150-350 angstroms or some other suitable value. In some embodiments, a thickness of the second etch stop layer 724 is about 50-300 angstroms or some other suitable value. The buffer layer 726 may, for example, be or comprise tetraethyl orthosilicate (TEOS) oxide and/or some other suitable dielectric(s). In some embodiments, a thickness of the buffer layer 726 is about 50-300 angstroms or some other suitable value.

Figure 7B:
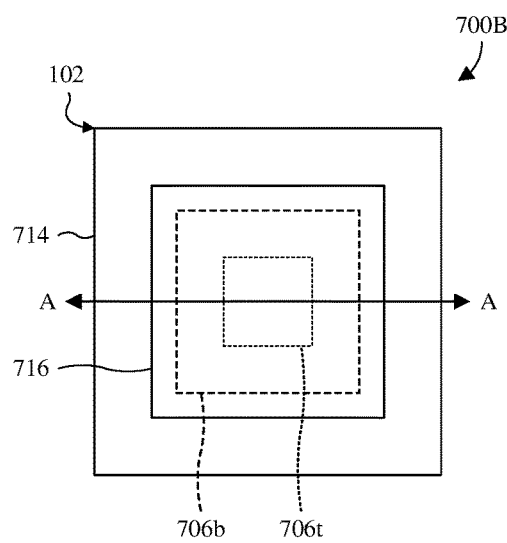

With reference to FIG. 7B, a top layout view 700B of some embodiments of the memory cell 102 of FIG. 7A is provided. The cross-sectional view 700A of FIG. 7A may, for example, be taken along line A. The memory cell 102 has a square or rectangular top layout, and the second common sidewalls 716 are laterally offset from and between the first common sidewalls 714. In alternative embodiments, the memory cell 102 may have a circular top layout or some other suitable top layout. Further, top layouts of the BEVA 706b and the TEVA 706t are illustrated in phantom overlaid on the memory cell 102. The BEVA 706b and the TEVA 706t have square or rectangular top layouts but may alternatively have circular top layouts or other suitable top layouts.

Figure 8A:
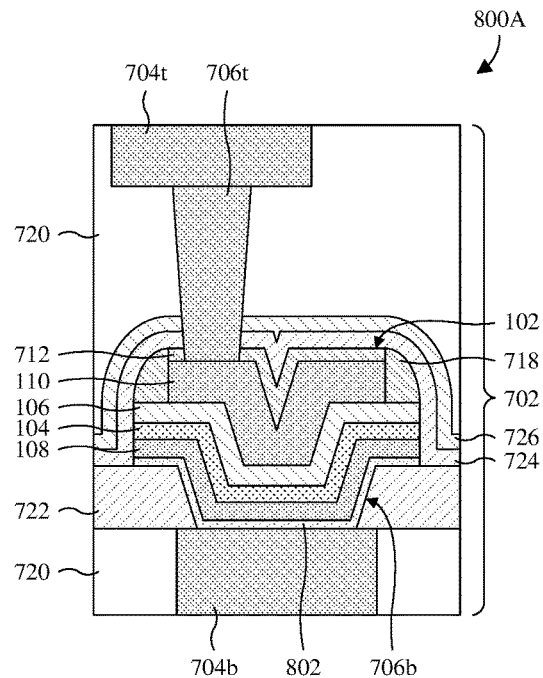
FIGS. 8A-8C illustrate cross-sectional views of some alternative embodiments of the memory cell of FIG. 7A in which a layout of the memory cell is varied.
Figure 8B:
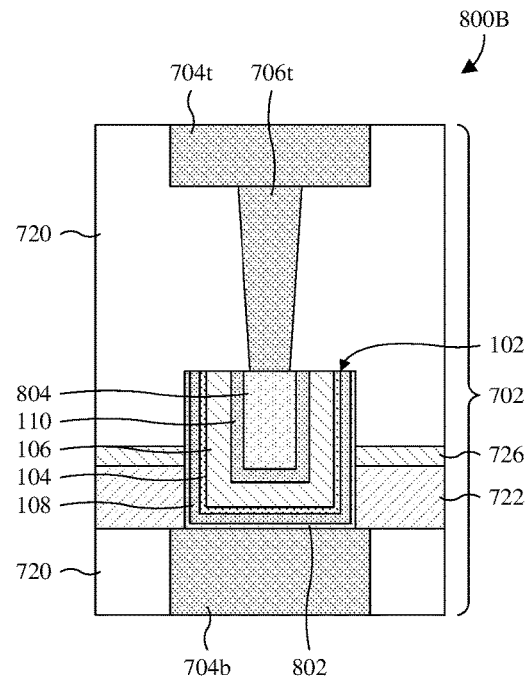
Figure 8C:
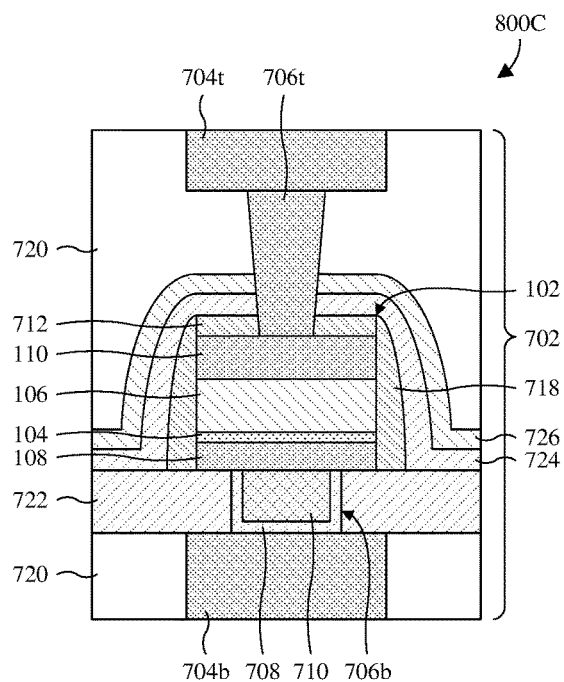

With reference to FIGS. 8A-8C, cross-sectional views 800A-800C of some alternative embodiments of the memory cell 102 of FIG. 7A are provided in which a layout of the memory cell 102 is varied.

In FIG. 8A, the BEVA barrier 708 and the BEVA body 710 are omitted, and a bottom electrode barrier 802 and the bottom electrode 108 form the BEVA 706b. The bottom electrode barrier 802 is between the bottom electrode 108 and the bottom electrode wire 704b and may, for example, be as the BEVA barrier 708 is described with regard to FIG. 7A. The bottom electrode barrier 802, the bottom electrode 108, the interfacial layer 104, the ferroelectric layer 106, the top electrode 110, and the hard mask 712 are depressed at the BEVA 706b, and the TEVA 706t is laterally offset from a center of the memory cell 102.

In FIG. 8B, the BEVA 706b, the BEVA barrier 708, the BEVA body 710, the sidewall spacer structure 718, the second etch stop layer 724, and the hard mask 712 are omitted. Further, a bottom electrode barrier 802, the bottom electrode 108, the interfacial layer 104, the ferroelectric layer 106, and the top electrode 110 cup an underside of a top electrode barrier 804. The bottom electrode barrier 802 is between the bottom electrode 108 and the bottom electrode wire 704b, whereas the top electrode barrier 804 is between the top electrode 110 and the TEVA 706t. The bottom electrode barrier 802 and/or the top electrode barrier 804 may, for example, be as the BEVA barrier 708 is described with regard to FIG. 7A.

In FIG. 8C, the bottom electrode 108, the interfacial layer 104, the ferroelectric layer 106, the top electrode 110, and the hard mask 712 share a common width and form a pair of common sidewalls respectively on opposite sides of the memory cell 102. Further, the sidewall spacer structure 718 lines the common sidewalls. The common sidewalls have planar profiles but may alternatively have curved profiles or other suitable profiles.

Figure 9:
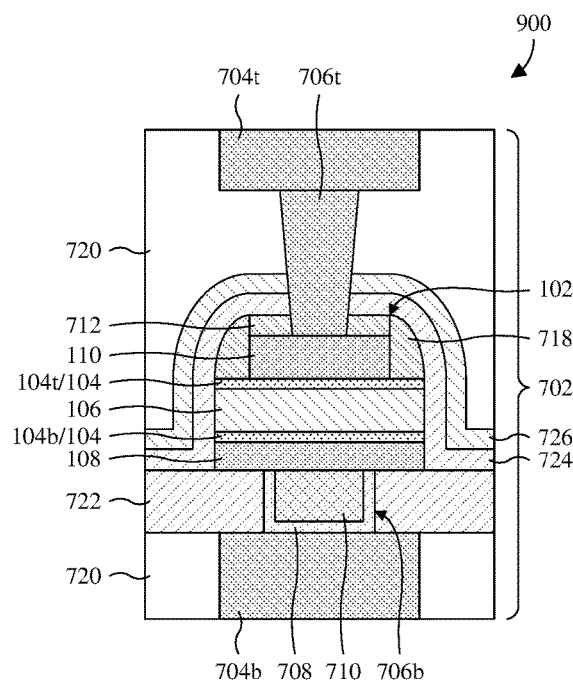
FIG. 9 illustrates a cross-sectional view of some alternative embodiments of the memory cell of FIG. 7A in which an additional interfacial layer is on a top of the ferroelectric layer as in FIG. 3.

With reference to FIG. 9, a cross-sectional view 900 of some alternative embodiments of the memory cell 102 of FIG. 7A is provided in which the memory cell 102 further comprises an additional interfacial layer 104 as in FIG. 3. The additional interfacial layer 104 may, for example, be referred to as a top interfacial layer 104t, whereas the interfacial layer 104 from FIG. 7A may, for example, be referred to as a bottom interfacial layer 104b.

The bottom electrode 108, the bottom interfacial layer 104b, the ferroelectric layer 106, and the top interfacial layer 104t share a first common width and form a pair of first common sidewalls respectively on opposite sides of the memory cell 102. Further, the top electrode 110 and the hard mask 712 share a second common width and form a pair of second common sidewalls respectively on the opposite sides of the memory cell 102. The second common width is less than the first common width, and the second common sidewalls are laterally between the first common sidewalls. Further, the sidewall spacer structure 718 overlies the top interfacial layer 104t and is on the second common sidewalls.

In some embodiments, the bottom interfacial layer 104b is a group 2 material as described with regard to FIG. 2B, whereas the top interfacial layer 104t is a group 1 material as described with regard to FIG. 2A. In alternative embodiments, the bottom interfacial layer 104b and/or the top interfacial layer 104t is/are some other suitable material(s).

With reference to FIGS. 10A-10E, cross-sectional views 1000A-1000E of some alternative embodiments of the memory cell 102 of FIG. 9 are provided in which a layout of the memory cell 102 is varied.

Figure 10A:
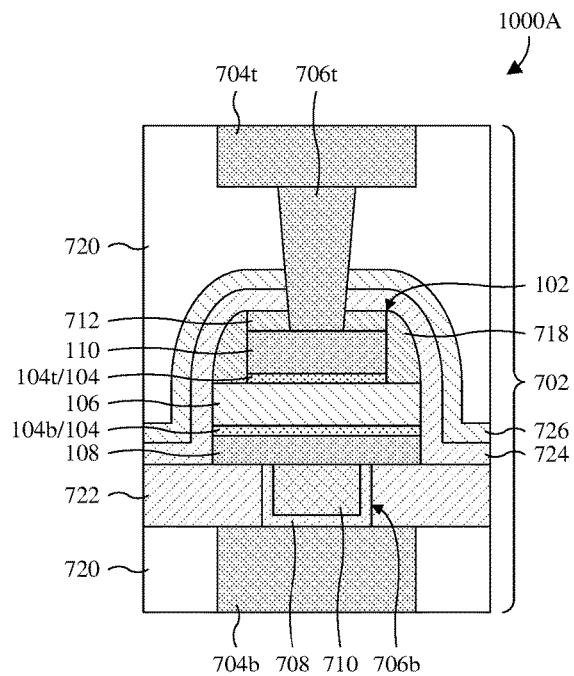
FIGS. 10A-10E illustrate cross-sectional views of some alternative embodiments of the memory cell of FIG. 9 in which a layout of the memory cell is varied.

In FIG. 10A, the top interfacial layer 104t, the top electrode 110, and the hard mask 712 share a common width less than that of the ferroelectric layer 106. Further, the sidewall spacer structure 718 overlies the ferroelectric layer 106 on a sidewall of the top interfacial layer 104t. In some embodiments, the bottom interfacial layer 104b is a group 1 material as described with regard to FIG. 2A, whereas the top interfacial layer 104t is a group 2 material as described with regard to FIG. 2B. In alternative embodiments, the bottom interfacial layer 104b and/or the top interfacial layer 104t is/are some other suitable material(s).

Figure 10B:
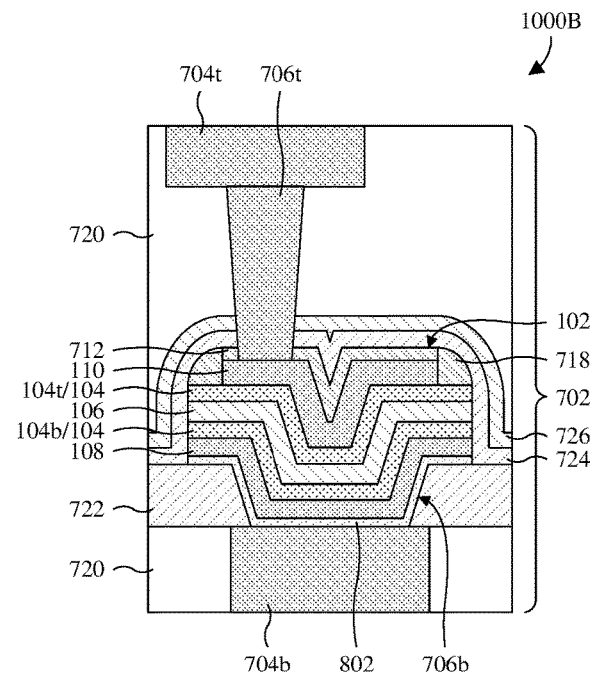

In FIG. 10B, the memory cell 102 is as in FIG. 8A except that the memory cell 102 further includes the top interfacial layer 104t of FIG. 9. In some embodiments, the bottom interfacial layer 104b is a group 2 material as described with regard to FIG. 2B, whereas the top interfacial layer 104t is a group 1 material as described with regard to FIG. 2A. In alternative embodiments, the bottom and top interfacial layers 104b, 104t are group 1 materials as described with regard to FIG. 2A. In alternative embodiments, the bottom interfacial layer 104b and/or the top interfacial layer 104t is/are some other suitable material(s).

Figure 10C:
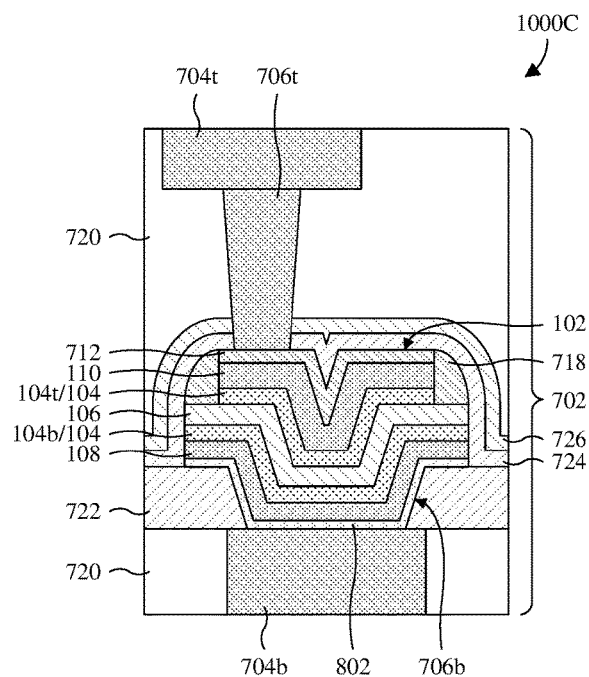

In FIG. 10C, the memory cell 102 is as in FIG. 10B except that the top interfacial layer 104t, the top electrode 110, and the hard mask 712 share a common width less than that of the ferroelectric layer 106. Further, the sidewall spacer structure 718 overlies the ferroelectric layer 106 on a sidewall of the top interfacial layer 104t. In some embodiments, the bottom and top interfacial layers 104b, 104t are group 2 materials as described with regard to FIG. 2B. In alternative embodiments, the bottom interfacial layer 104b is a group 1 material as described with regard to FIG. 2A, whereas the top interfacial layer 104t is a group 2 material as described with regard to FIG. 2B. In alternative embodiments, the bottom interfacial layer 104b and/or the top interfacial layer 104t is/are some other suitable material(s).

Figure 10D:
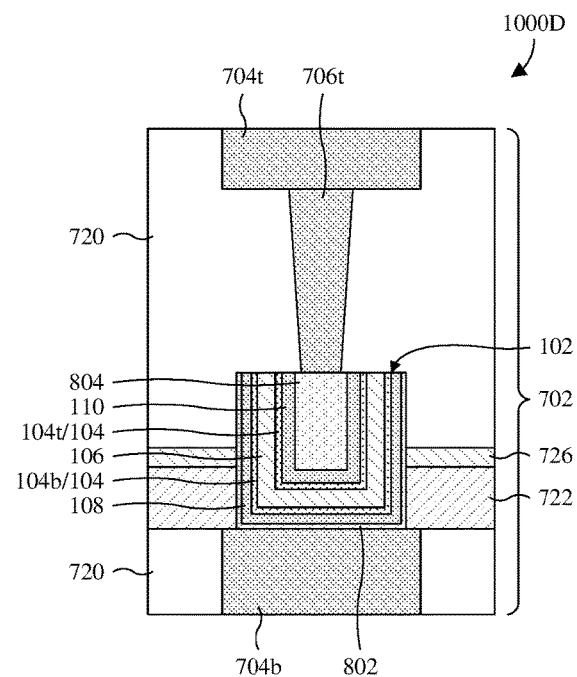

In FIG. 10D, the memory cell 102 is as in FIG. 8B except that the memory cell 102 further includes the top interfacial layer 104t of FIG. 9. In some embodiments, the bottom and top interfacial layers 104b, 104t are group 1 materials as described with regard to FIG. 2A. In alternative embodiments, the bottom interfacial layer 104b is a group 1 material as described with regard to FIG. 2A, whereas the top interfacial layer 104t is a group 2 material as described with regard to FIG. 2B. In alternative embodiments, the bottom interfacial layer 104b is a group 2 material as described with regard to FIG. 2B, whereas the top interfacial layer 104t is a group 1 material as described with regard to FIG. 2A. In alternative embodiments, the bottom and top interfacial layers 104b, 104t are group 2 materials as described with regard to FIG. 2B. In alternative embodiments, the bottom interfacial layer 104b and/or the top interfacial layer 104t is/are some other suitable material(s).

Figure 10E:
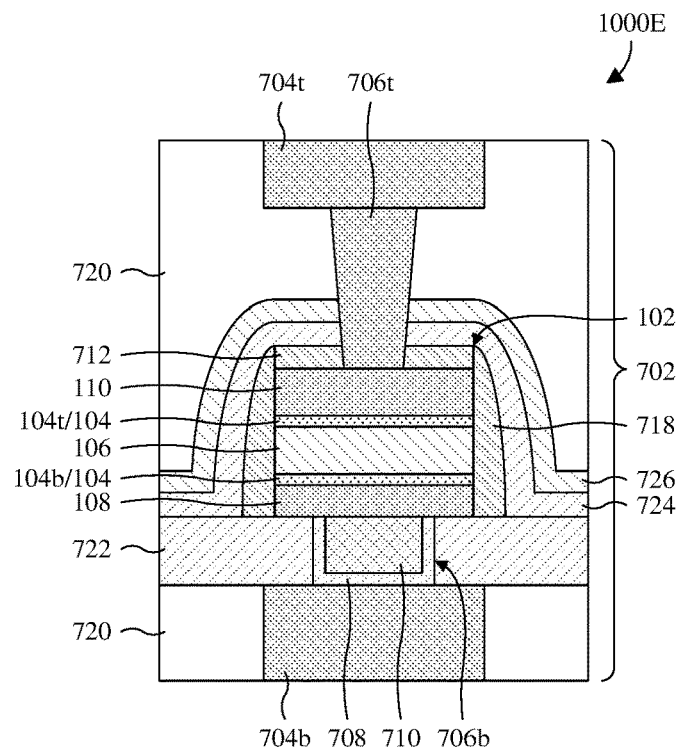

In FIG. 10E, the memory cell 102 is as in FIG. 8C except that the memory cell 102 further includes the top interfacial layer 104t of FIG. 9. In some embodiments, the bottom and top interfacial layers 104b, 104t are group 1 materials as described with regard to FIG. 2A. In alternative embodiments, the bottom interfacial layer 104b is a group 1 material as described with regard to FIG. 2A, whereas the top interfacial layer 104t is a group 2 material as described with regard to FIG. 2B. In alternative embodiments, the bottom interfacial layer 104b is a group 2 material as described with regard to FIG. 2B, whereas the top interfacial layer 104t is a group 1 material as described with regard to FIG. 2A. In alternative embodiments, the bottom and top interfacial layers 104b, 104t are group 2 materials as described with regard to FIG. 2B. In alternative embodiments, the bottom interfacial layer 104b and/or the top interfacial layer 104t is/are some other suitable material(s).

While FIGS. 7A and 8A-8C illustrate the memory cells 102 with a single interfacial layer 104 and a single ferroelectric layer 106 stacked from the bottom electrode 108 to the top electrode 110, the memory cells 102 may alternatively have a plurality of interfacial layers 104 and a plurality of ferroelectric layers 106 stacked from the bottom electrode 108 to the top electrode 110 as in FIG. 5. While FIGS. 9 and 10A-10E illustrate the memory cells 102 with a single ferroelectric layer stacked between two interfacial layers 104 from the bottom electrode 108 to the top electrode 110, the memory cells 102 may alternatively have a plurality of ferroelectric layers 106 alternatingly stacked with a plurality of interfacial layers 104 from the bottom electrode 108 to the top electrode 110 as in FIG. 6.

Figure 11A:
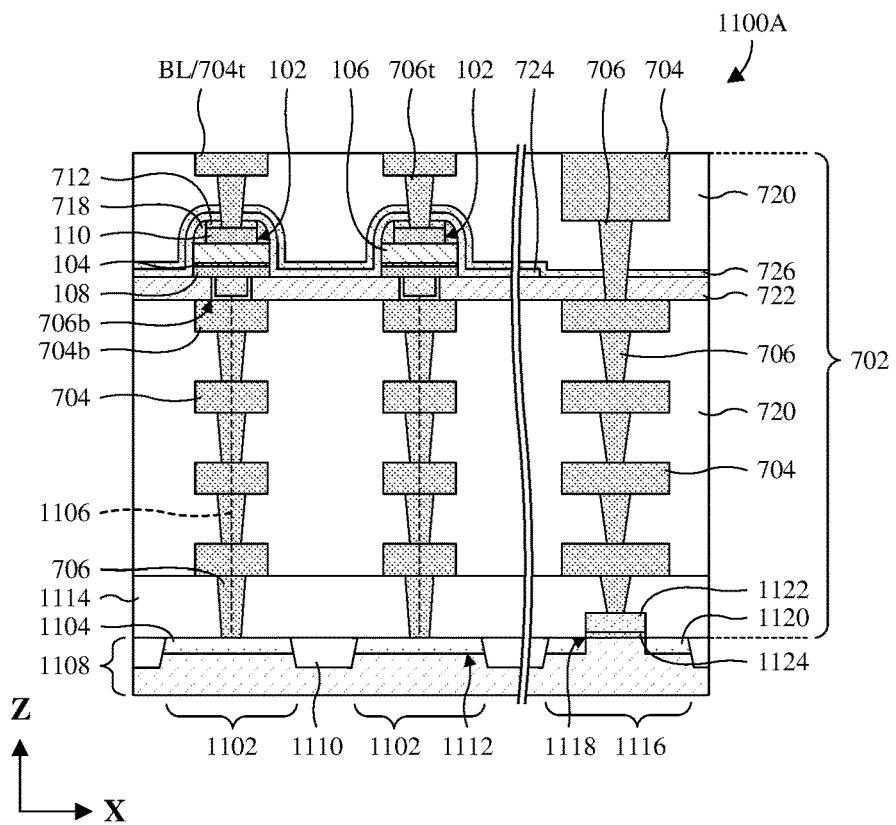
FIGS. 11A and 11B illustrate cross-sectional views of some embodiments of an IC chip comprising memory cells integrated into individual one-transistor one-capacitor (1T1C) cells and configured as in FIG. 7A.

With reference to FIG. 11A, a cross-sectional view 1100A of some embodiments of an IC chip comprising memory cells 102 is provided, where the memory cells 102 are integrated into individual one-transistor one-capacitor (1T1C) cells 1102. The memory cells 102 are each of as their counterpart is described with regard to FIG. 7A.

The 1T1C cells 1102 comprise individual drain regions 1104 and individual drain-side conductive paths 1106. The drain regions 1104 are doped regions of a substrate 1108 and each has an opposite doping type as an adjoining region of the substrate 1108. Further, the drain regions 1104 are electrically separated by a trench isolation structure 1110 and partially surround or define access transistors 1112 (partially shown) used to individually select the memory cells 102. The trench isolation structure 1110 extends into a top of the substrate 1108 and comprises silicon oxide and/or some other suitable dielectric material(s). The substrate 1108 may, for example, be a bulk silicon substrate or some other suitable semiconductor substrate.

The drain-side conductive paths 1106 electrically couple the drain regions 1104 to the memory cells 102. Further, the drain-side conductive paths 1106 are formed by an interconnect structure 702 within which the memory cells 102 are arranged. The interconnect structure 702 comprises a plurality of wires 704 and a plurality of vias 706. The plurality of wires 704 comprises top electrode wires 704t and bottom electrode wires 704b. In some embodiments, the top electrode wires 704t correspond to bit lines BL. The plurality of vias 706 comprises TEVAs 706t. A level of the vias 706 nearest the substrate 1108 is in an interlayer dielectric (ILD) layer 1114, whereas remaining levels of the vias 706 and the wires 704 are in IMD layers 720. The wires 704 and the vias 706 may be or comprise, for example, copper, aluminum, some other suitable metal(s), or any combination of the foregoing.

A peripheral region 1116 to a side of the 1T1C cells 1102 accommodates peripheral devices 1118 (only one of which is shown). The peripheral devices 1118 may, for example, be metal-oxide-semiconductor field-effect transistors (MOSFETs), fin field-effect transistors (finFETs), gate-all-around field-effect transistors (GAA FETs), or some other suitable type of semiconductor device. Each of the peripheral devices 1118 comprises a pair of source/drain regions 1120 in the substrate 1108, as well as a gate electrode 1122 and a gate dielectric layer 1124 stacked between the source/drain regions 1120.

Figure 11B:
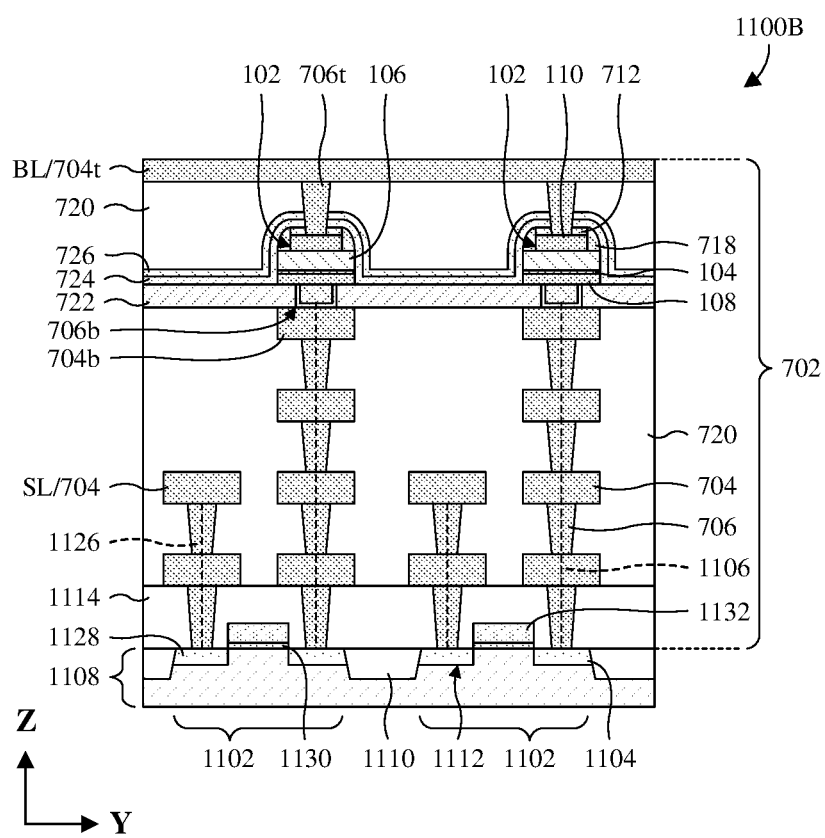

With reference to FIG. 11B, a cross-sectional view 1100B of some embodiments of the IC chip of FIG. 11A is provided along an axis orthogonal to that which the cross-sectional view 1100A of FIG. 11A is taken. The 1T1C cells 1102 comprise individual memory cells 102, individual drain-side conductive paths 1106, individual access transistors 1112, and individual source-side conductive paths 1126. The memory cells 102 are each of as their counterpart is described with regard to FIG. 7A.

The access transistors 1112 are on the substrate 1108, between the substrate 1108 and the interconnect structure 702, and are electrically separated by the trench isolation structure 1110. The access transistors 1112 comprise individual drain regions 1104, individual source regions 1128, individual gate dielectric layers 1130, and individual gate electrodes 1132. The gate electrodes 1132 respectively overlie the gate dielectric layers 1130 and, in some embodiments, form word lines. The drain and source regions 1104, 1128 are doped regions of the substrate 1108 and each has an opposite doping type as an adjoining region of the substrate 1108. Further, the drain and source regions 1104, 1128 respectively border the gate electrodes 1132. The access transistors 1112 may, for example, be MOSFETs, finFETs, GAA FETs, or some other suitable type of semiconductor device.

The drain-side conductive paths 1106 electrically couple the drain regions 1104 to the memory cells 102, and the source-side conductive paths 1126 electrically couple the source regions 1128 to source lines SL. The drain-side and source-side conductive paths 1106, 1126 are formed by the plurality of wires 704 and the plurality of vias 706.

While FIGS. 11A and 11B are illustrated using memory-cell embodiments as in FIG. 7A, memory-cell embodiments as in any of FIGS. 1, 2A, 2B, 3, 4A-4D, 5, 6, 8A-8C, 9, and 10A-10E are amenable in alternative embodiments. For example, the memory cells 102 of FIGS. 11A and 11B may comprise additional interfacial layers 104 at top surfaces of the ferroelectric layers 106 as in FIG. 9.

Figure 12:
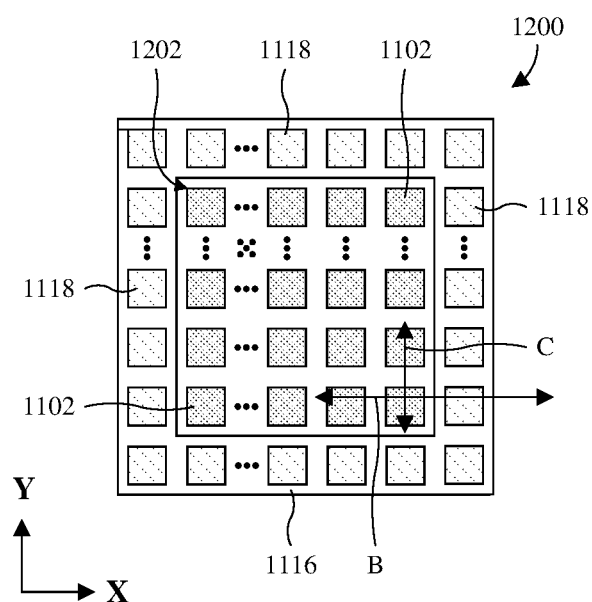
FIG. 12 illustrates a top layout view of some embodiments of the IC chip of FIGS. 11A and 11B.

With reference to FIG. 12, a top layout view 1200 of some embodiments of the IC chip of FIGS. 11A and 11B is provided. The cross-sectional views 1100A, 1100B of FIGS. 11A and 11B may, for example, respectively be taken along lines B and C. The IC chip comprises a plurality of 1T1C cells 1102 in a plurality of rows and a plurality of columns, thereby forming a memory array 1202. Peripheral devices 1118 surround the memory array 1202 at a peripheral region 1116 of the IC chip. The peripheral devices 1118 may, for example, implement read/write circuitry and/or other suitable circuitry for operating the 1T1C cells 1102.

Figure 13:
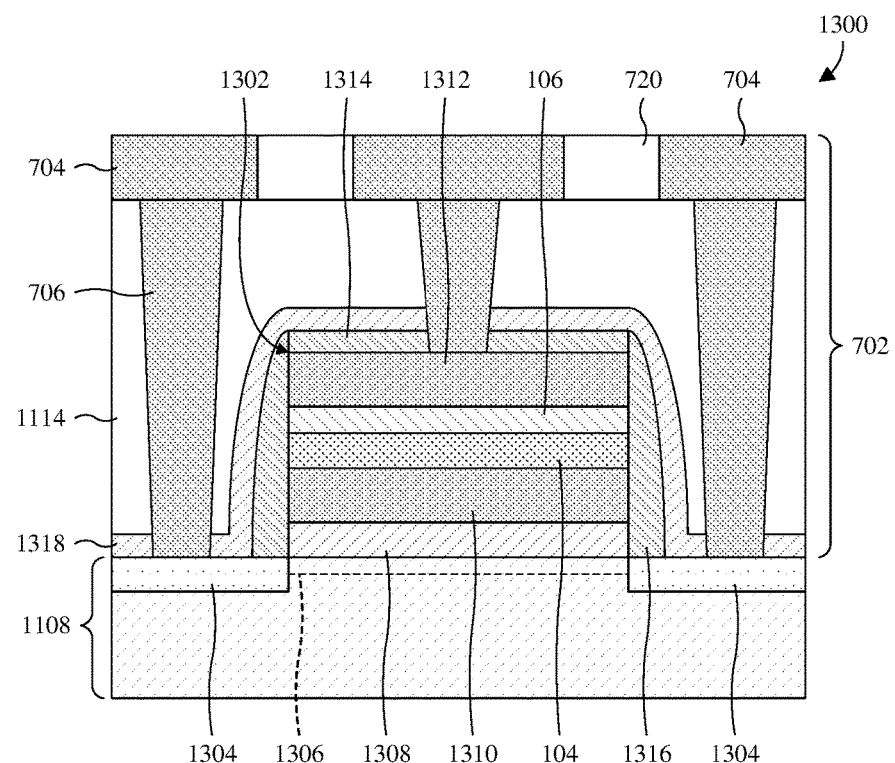
FIG. 13 illustrates a cross-sectional view of some embodiments of an IC chip comprising a ferroelectric field-effect transistor (FeFET) in which an interfacial layer with high texture uniformity is on a bottom of a ferroelectric layer.

With reference to FIG. 13, a cross-sectional view 1300 of some embodiments of an IC chip comprising a ferroelectric field-effect transistor (FeFET) 1302 in which an interfacial layer 104 with high texture uniformity is on a bottom of a ferroelectric layer 106. A pair of source/drain regions 1304 is in a substrate 1108, and a channel region 1306 of the substrate 1108 separates the source/drain regions 1304. The source/drain regions 1304 may, for example, be doped regions of the substrate 1108 or some other suitable semiconductor region.

A gate dielectric layer 1308, a floating gate electrode 1310, the interfacial layer 104, the ferroelectric layer 106, a top gate electrode 1312, and a hard mask 1314 form a gate stack overlying the channel region 1306 and share a common width. In alternative embodiments, the floating gate electrode 1310 and/or the gate dielectric layer 1308 is/are omitted. The interfacial layer 104 and the ferroelectric layer 106 are as described with regard to any of FIGS. 1, 2A, and 2B, and the interfacial layer 104 has high texture uniformity to enhance, and/or improve uniformity of, properties of the ferroelectric layer 106. Such properties may, for example, include remanent polarization and other suitable properties. In some embodiments, the floating gate electrode 1310 and the top gate electrode 1312 are respectively as the bottom electrode 108 and the top electrode 110 are described with regard to any of FIGS. 1, 2A, and 2B.

A sidewall spacer structure 1316 is on opposite sidewalls of the gate stack, and an interconnect structure 702 overlies and electrically couples to the FeFET 1302. The interconnect structure 702 comprises a plurality of wires 704 and a plurality of vias 706 stacked to define conductive paths leading from the FeFET 1302. While only one level of vias 706 and one level of wires 704 are shown, additional levels are amenable. A contact etch stop layer 1318 covers and lines the FeFET 1302, and an ILD layer 1114 and an IMD layer 720 are stacked over the contact etch stop layer 1318. The contact etch stop layer 1318 and the ILD layer 1114 surround the vias 706, and the IMD layer 720 surrounds the wires 704.

In some embodiments, the hard mask 1314 is or comprises titanium nitride, silicon oxide, silicon nitride, silicon carbide nitride, silicon oxide nitride, metal oxide, some other suitable material(s), or any combination of the foregoing. In some embodiments, the sidewall spacer structure 718 is or comprises titanium nitride, silicon oxide, silicon nitride, silicon carbide nitride, silicon oxide nitride, metal oxide, some other suitable material(s), or any combination of the foregoing. In some embodiments, the contact etch stop layer 1318 is or comprises metal nitride, metal oxide, metal carbide, silicon nitride, silicon oxide, silicon carbide, silicon oxynitride, some other suitable dielectric(s), or any combination of the foregoing.

During operation of the FeFET 1302, the remanent polarization of the ferroelectric layer 106 is used to represent a bit of data. For example, a positive polarity of the remanent polarization may represent a binary "0", whereas a negative polarity of the remanent polarization may represent a binary "1", or vice versa.

To set the remanent polarization to the positive polarity, a first write voltage is applied across the ferroelectric layer 106 from the top gate electrode 1312 to the channel region 1306 (e.g., via the source/drain regions 1304). To set the remanent polarization to the negative polarity, a second write voltage is applied across the ferroelectric layer 106 from the top gate electrode 1312 to the channel region 1306. The first and second write voltage have opposite polarities and have magnitudes in excess of the coercive voltage.

The polarity of the remanent polarization shifts a threshold voltage of the FeFET 1302. Depending on whether the remanent polarization is in the positive polarity or the negative polarity, the threshold voltage is at a first threshold value or a second threshold value. To read the polarity of the remanent polarization, a read voltage less than the coercive voltage, and between the first and second threshold voltages, is applied from the top gate electrode 1312 to a source one of the source/drain regions 1304. Depending on whether the channel region 1306 conducts, the remanent polarization has the positive polarity or the negative polarity.

While FIG. 13 illustrates the FeFET 1302 with a single interfacial layer 104 on the ferroelectric layer 106, the FeFET 1302 may alternatively have a pair of interfacial layers 104 on the ferroelectric layer 106 as in FIG. 3. While FIG. 13 illustrates the FeFET 1302 with a single interfacial layer 104 and a single ferroelectric layer 106 stacked from the floating gate electrode 1310 to the top gate electrode 1312, the FeFET 1302 may alternatively have a plurality of interfacial layers 104 and a plurality of ferroelectric layers 106 stacked from the floating gate electrode 1310 to the top gate electrode 1312 as in FIG. 5 or 6.

With reference to FIGS. 14-26, a series of cross-sectional views 1400-2600 of some embodiments of a method for forming an IC chip comprising memory cells is provided, where the memory cells are integrated into individual 1T1C cells and comprise individual interfacial layers with high texture uniformity on bottoms of individual ferroelectric layers. The cross-sectional views 1400-2600 may, for example, correspond to alternative embodiments of the IC chip of FIG. 11A in which the memory cells are as in FIG. 9. Further, the cross-sectional views 1400-2600 may, for example, be taken along line B in FIG. 12.

Figure 14:
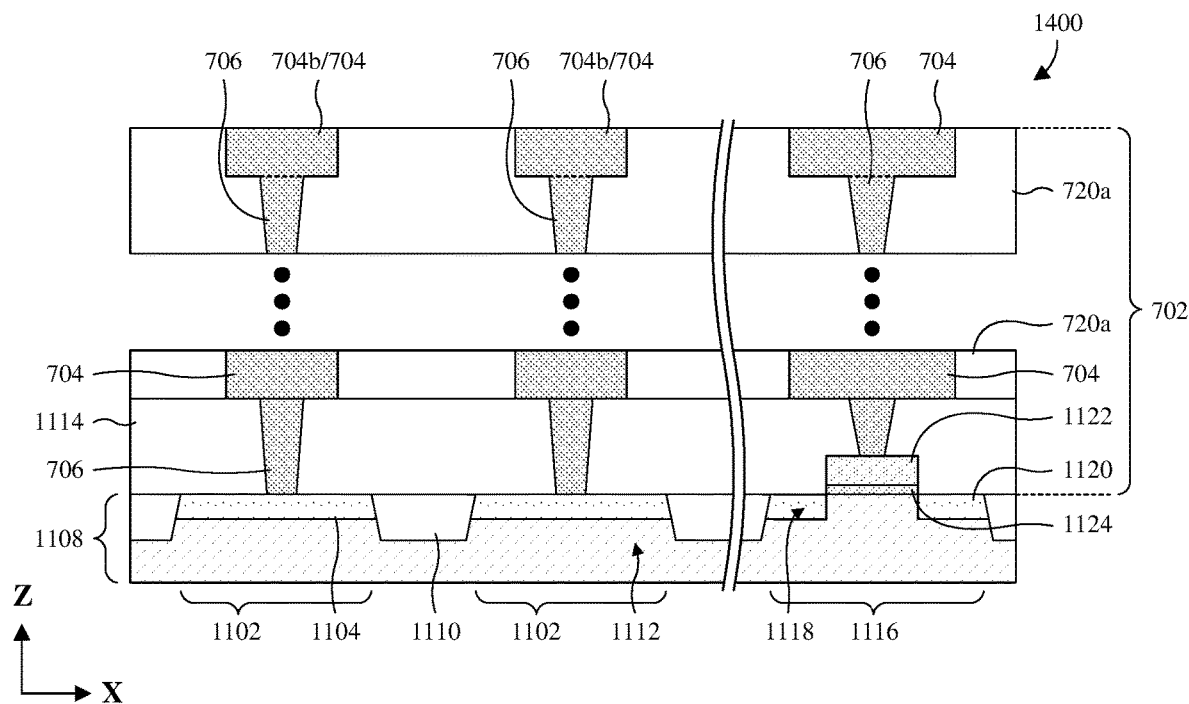
FIGS. 14-26 illustrate a series of cross-sectional views of some embodiments of a method for forming an IC chip comprising memory cells which are integrated into individual 1T1C cells and in which interfacial layers with high texture uniformity are on bottoms of ferroelectric layers.

As illustrated by the cross-sectional view 1400 of FIG. 14, an interconnect structure 702 is partially formed over and electrically coupled to a plurality of access transistors 1112 (only partially shown) and a peripheral device 1118. The access transistors 1112 are individual to and respectively at a plurality of 1T1C cells 1102 being formed, and the peripheral device 1118 is at a peripheral region 1116 of the IC chip being formed. The access transistors 1112 and the peripheral device 1118 are on and partially formed by a substrate 1108 and are separated by a trench isolation structure 1110 in the substrate 1108. The access transistors 1112 and the peripheral device 1118 may, for example, be as described with regard to FIGS. 11A and 11B.

The interconnect structure 702 comprises a plurality of wires 704 and a plurality of vias 706 that are stacked in a dielectric structure. The dielectric structure comprises an ILD layer 1114 and a first IMD layer 720a over the ILD layer 1114. The plurality of wires 704 comprises a plurality of bottom electrode wires 704b along a top surface of the interconnect structure 702. The bottom electrode wires 704b are individual to and respectively at the 1T1C cells 1102 being formed. Further, the bottom electrode wires 704b are respectively electrically coupled to drain regions 1104 of the access transistors 1112. The first IMD layer 720a may, for example, be formed by and/or using chemical vapor deposition (CVD), physical vapor deposition (PVD), atomic layer deposition (ALD), some other suitable deposition process(es), or any combination of the foregoing. The wires 704 and the vias 706 may, for example, be formed by and/or using CVD, PVD, ALD, electroless plating, electroplating, some other suitable deposition process(es), or any combination of the foregoing.

Figure 15:
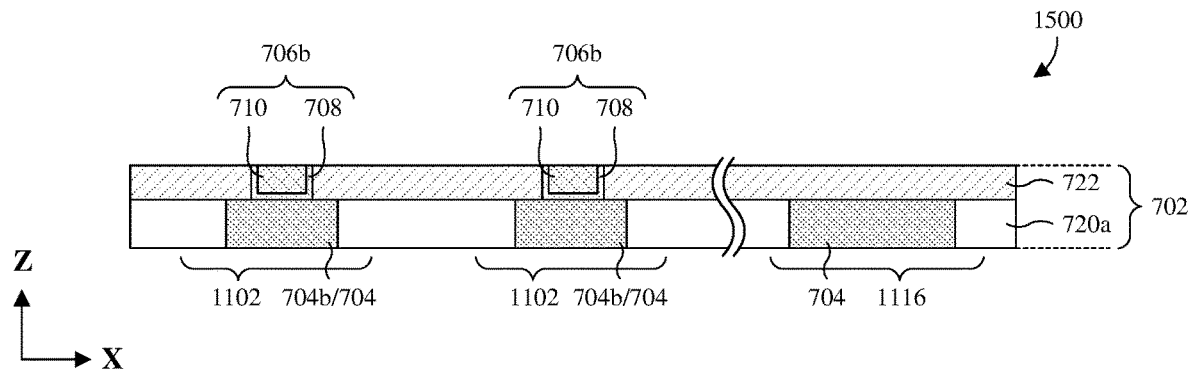

As illustrated by the cross-sectional view 1500 of FIG. 15, a first etch stop layer 722 is deposited or otherwise formed on the interconnect structure 702. Note that for drawing compactness, a lower portion of the interconnect structure 702 is omitted herein and in subsequent figures. The first etch stop layer 722 is a dielectric and may, for example, be deposited by CVD, PVD, ALD, some other suitable deposition process(es), or any combination of the foregoing.

Also illustrated by the cross-sectional view 1500 of FIG. 15, BEVAs 706*b* are formed extending through the first etch stop layer 722 respectively to the bottom electrode wires 704*b*. The BEVAs 706*b* comprise individual BEVA bodies 710 and individual BEVA barriers 708 respectively cupping undersides of the BEVA bodies 710. The BEVA bodies 710 and/or the BEVA barriers 708 may, for example, be formed by and/or using CVD, PVD, ALD, some other suitable deposition process(es), or any combination of the foregoing.

Figure 16:
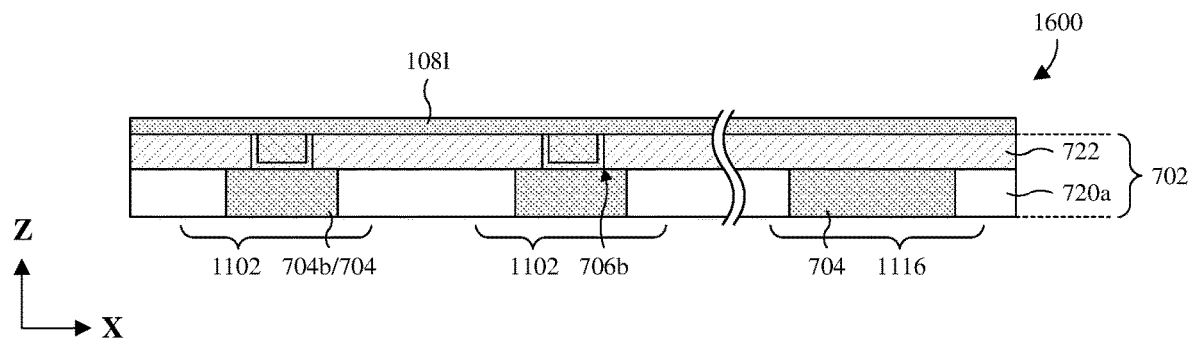

As illustrated by the cross-sectional view 1600 of FIG. 16, a bottom electrode layer 1081 is deposited over the BEVAs 706*b* and the first etch stop layer 722. The bottom electrode layer 1081 is conductive and may, for example, be or comprise titanium nitride, tantalum nitride, ruthenium, platinum, iridium, molybdenum, tungsten, doped polysilicon, some other suitable conductive material(s), or any combination of the foregoing. The bottom electrode layer 1081 may, for example, be deposited by CVD, PVD, ALD, some other suitable deposition process(es), or any combination of the foregoing.

Figure 17:
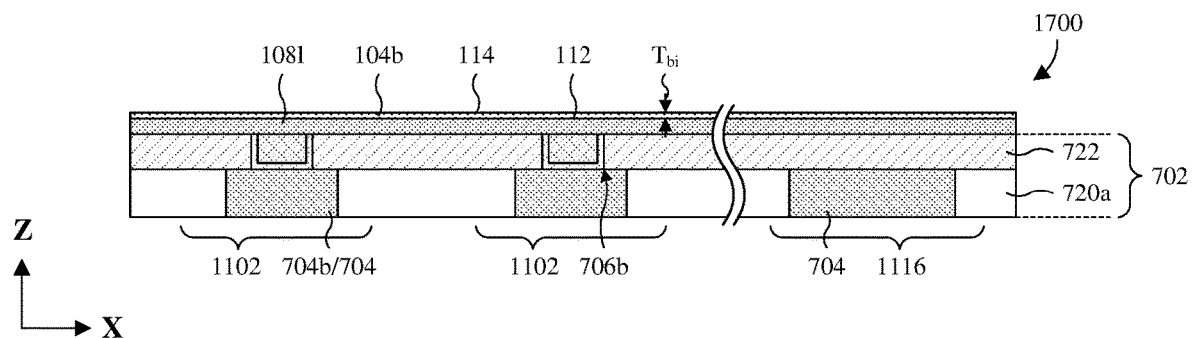

As illustrated by the cross-sectional view 1700 of FIG. 17, a bottom interfacial layer 104*b* is deposited over the bottom electrode layer 1081. The bottom interfacial layer 104*b* may, for example, be deposited by CVD, PVD, ALD, some other suitable deposition process(es), or any combination of the foregoing.

The bottom electrode layer 1081 and the bottom interfacial layer 104*b* have individual top surfaces 112, 114 respectively and comparatively with low texture uniformity and high texture uniformity. In other words, compared to the top surface 112 of the bottom electrode layer 1081, the top surface 114 of the bottom interfacial layer 104*b* has increased texture uniformity. Texture may, for example, correspond to deviation of a surface from a perfectly flat plain in terms of lay, roughness, waviness, other suitable parameter(s), or any combination of the foregoing. Lay may, for example, refer to direction of the predominant surface pattern. Roughness may, for example, refer to a measure of spaced irregularities of the surface. Waviness parameters may, for example, refer to a measure of spaced irregularities of the surface on which roughness is overlaid. Compared to the irregularities of the roughness, the irregularities of waviness are larger and have a greater spacing.

In some embodiments, texture at the top surfaces 112, 114 respectively of the bottom electrode layer 1081 and the bottom interfacial layer 104*b* is measured using interferometry, AFP, some other suitable methodology, or any combination of the foregoing and/or is measured using a profilometer or some other suitable tool.

In some embodiments, texture at the top surfaces 112, 114 respectively of the bottom electrode layer 1081 and the bottom interfacial layer 104*b* is quantified using average roughness. For example, a first set of average roughness measurements may be measured at multiple locations evenly spread across the top surface 112 of the bottom electrode layer 1081, and a second set of average roughness measurements may be measured at multiple locations evenly spread across the top surface 114 of the bottom interfacial layer 104*b*. In some embodiments, because of the increased texture uniformity at the top surface 112 of the bottom interfacial layer 104*b*, an average of the second set of measurements may be less than an average of the first set of measurements. Further, variation of the second set of measurements may be less than that of the first set of measurements. Variation for a set of measurements (e.g., the first or second set of measurements) may, for example, be determined as (MAX-MIN)/(2×AVG), where MAX corresponds to the maximum measurement, MIN corresponds to the minimum measurement, and AVG corresponds to the average of the measurements.

In some embodiments, the bottom interfacial layer 104*b* is or comprises: (1) an amorphous dielectric; (2) an amorphous metal oxide; (3) an amorphous metal; (4) some other suitable material(s); or (5) or any combination of the foregoing. The amorphous metal may, for example, be limited to or consist essentially of one or more metal elements. The amorphous dielectric may, or may not, be or comprise a metal oxide and may, or may not, comprise oxide. It has been appreciated that amorphousness of the bottom interfacial layer 104*b* may lead to high texture uniformity at the top surface 112 of the bottom interfacial layer 104*b*.

In other embodiments, the bottom interfacial layer 104*b* is or comprises: (1) a crystalline dielectric; (2) a crystalline metal oxide; (3) a crystalline metal; (4) some other suitable material(s); or (5) or any combination of the foregoing. The crystalline metal may, for example, be limited to or consist essentially of one or more metal elements. The crystalline dielectric may, or may not, be or comprise a metal oxide and may, or may not, comprise oxide.

In some embodiments in which the bottom interfacial layer 104*b* is a crystalline dielectric, metal oxide, or metal, the interfacial layer: (1) is monocrystalline; (2) has low grain size variation; (3) has a high percentage of grains sharing a common orientation; (4) has a high percentage of grains having a small grain size; or 5) is/has any combination of the foregoing. It has been appreciated that such crystalline properties may lead to high texture uniformity at the top surface 114 of the bottom interfacial layer 104*b*. In at least some embodiments, properties (1) to (4) are ordered from most effective to least effect at increasing texture uniformity.

Grain size variation may, for example, be determined as (MAX-MIN)/(2×AVG)*100, where MAX corresponds to the maximum grain size, MIN corresponds to the minimum grain size, and AVG corresponds to the average grain size. The low grain size variation at (2) may, for example, be grain size variation less than about 10%, about 5%, or some other suitable value. The high percentage at (3) and/or (4) may, for example, be a percentage greater than about 90%, about 95%, or some other suitable value. The grain orientation at (3) may, for example, be represented using the Miller index or some other suitable notation system and/or may, for example, be measured by XRD or by some other suitable methodology. In some embodiments in which the bottom interfacial layer 104*b* is crystalline titanium nitride, more than about 90% of grains may share an orientation of (111). The small grain size at (4) may, for example, correspond to average grain size, maximum grain size, median grain size, or the like less than or equal to about 1 nanometer, 0.5 nanometers, or some other suitable value.

In some embodiments in which the bottom interfacial layer 104*b* is or comprises a crystalline dielectric or metal oxide, the crystalline dielectric or metal oxide has a crystallization temperature above about 400 degrees Celsius, about 700 degrees Celsius, about 1000 degrees Celsius, or some other suitable value. For example, the crystalline dielectric or metal oxide may be or comprise aluminum oxide (e.g., $Al_2O_3$), silicon oxide (e.g., $SiO_2$), ruthenium oxide (e.g., RuO), some other suitable material, or any combination of the foregoing.

In some embodiments in which the bottom interfacial layer 104*b* is or comprises a dielectric or metal oxide, regardless of whether amorphous or crystalline, the bottom interfacial layer 104*b* has a high energy band gap. Such a high energy band gap may, for example, be a band gap greater than that of a ferroelectric layer hereafter formed on the bottom interfacial layer 104b. The high energy band gap may reduce leakage current.

In some embodiments, a thickness $T_{bi}$ of the bottom interfacial layer 104b is greater than 0 and is about 5-100 angstroms, about 5-50 angstroms, about 50-100 angstroms, or some other suitable value. To the extent that the thickness $T_{bi}$ is less than about 50 angstroms and the bottom interfacial layer 104b is crystalline, an average grain size of the bottom interfacial layer 104b is generally less than about 5 angstroms or some other suitable value.

Figure 18:
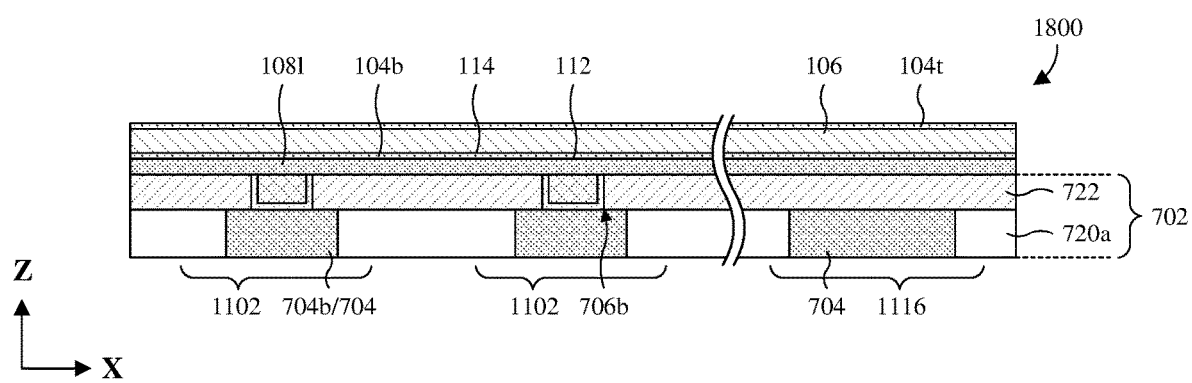

As illustrated by the cross-sectional view 1800 of FIG. 18, a ferroelectric layer 106 is deposited directly on the bottom interfacial layer 104b. In at least some embodiments, the bottom interfacial layer 104b serves as a crystalline seed for the ferroelectric layer 106. The deposition may, for example, be performed by CVD, PVD, ALD, some other suitable deposition process(es), or any combination of the foregoing.

As noted above, the top surface 112 of the bottom interfacial layer 104b has higher texture uniformity than the top surface 114 of the bottom electrode layer 1081. It has been appreciated that forming the ferroelectric layer 106 on a surface having high texture uniformity instead of low texture uniformity enhances, and/or increases uniformity of, properties of the ferroelectric layer 106. Non-limiting examples of such properties include remanent polarization, surface roughness, texture uniformity, other suitable properties, or any combination of the foregoing. Therefore, because the ferroelectric layer 106 is formed on the top surface 112 of the bottom interfacial layer 104b instead of on the top surface 114 of the bottom electrode layer 1081, properties of the ferroelectric layer 106 may be enhanced and/or may have high uniformity. For example, remanent polarization may have high uniformity, whereby bulk manufacturing yields may be low. As another example, remanent polarization may be enhanced, whereby read operations may be less prone to failure. Further, because properties of the ferroelectric layer 106 may be enhanced and/or may have high uniformity, the memory cells being formed may be scaled down more than would than would otherwise be possible.

Also illustrated by the cross-sectional view 1800 of FIG. 18, a top interfacial layer 104t is deposited over the ferroelectric layer 106. In alternative embodiments, the top interfacial layer 104t is omitted to form memory cells according to embodiments at FIG. 7A. The top interfacial layer 104t may, for example, be as the bottom interfacial layer 104b is described with regard to FIG. 17 and/or may, for example, be deposited by CVD, PVD, ALD, some other suitable deposition process(es), or any combination of the foregoing. To the extent that the top interfacial layer 104t has an energy band gap greater than that of the ferroelectric layer 106, the top interfacial layer 104t may reduce leakage current with the memory cells being formed.

Figure 19:
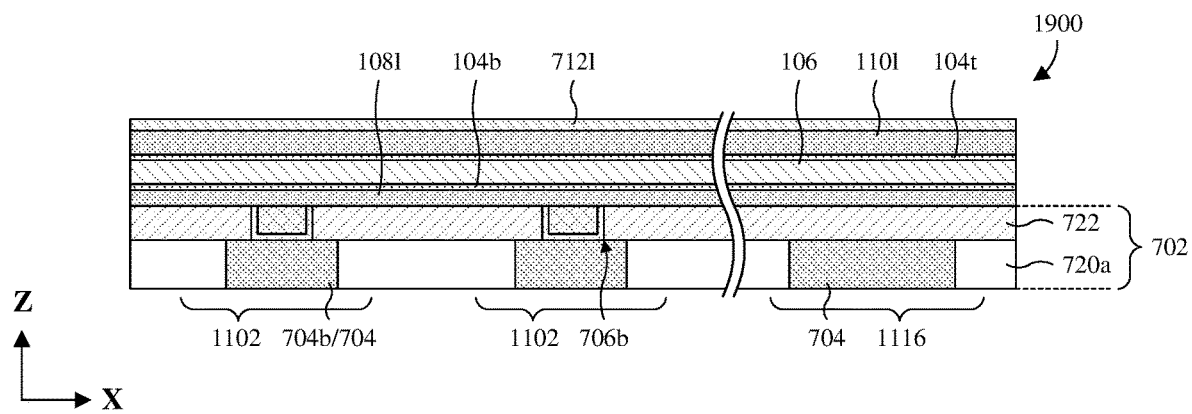

As illustrated by the cross-sectional view 1900 of FIG. 19, a top electrode layer 1101 is deposited over the top interfacial layer 104t, and a hard mask layer 7121 is deposited over the top electrode layer 1101. The top electrode layer 1101 and/or the hard mask layer 7121 may, for example, be deposited by CVD, PVD, ALD, some other suitable deposition process(es), or any combination of the foregoing.

Figure 20:
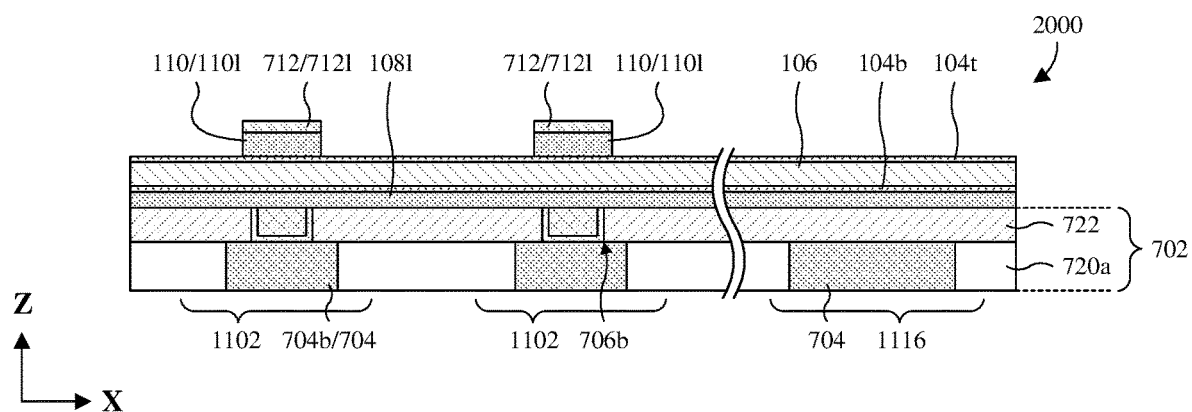

As illustrated by the cross-sectional view 2000 of FIG. 20, the hard mask layer 7121 is patterned to segment the hard mask layer 7121 into hard masks 712 individual to the 1T1C cells 1102 being formed. As seen hereafter, the hard masks 712 have patterns for memory cells being formed. The patterning may, for example, be performed by a photolithography/etching process or some other suitable patterning process.

Also illustrated by the cross-sectional view 2000 of FIG. 20, a first etch is performed into the top electrode layer 1101 with the hard masks 712 in place. In some embodiments in which the hard mask layer 7121 is patterned by a photolithography/etching process, an etch of the photolithography/etching process is the same as the first etch. The first etch stops on the top interfacial layer 104t and transfers patterns of the hard masks 712 to the top electrode layer 1101, thereby segmenting the top electrode layer 1101. The segments are individual to and respectively at the 1T1C cells 1102 being formed and are hereafter referred to as top electrodes 110. In some embodiments, the top interfacial layer 104t is a group 1 material, whereas the bottom interfacial layer 104b is a group 2 material. A group 1 material is a dielectric or metal oxide that is amorphous or crystalline as described with regard to FIG. 17. A group 2 material is conductive and is a metal that is amorphous or crystalline as described with regard to FIG. 17.

Figure 21:
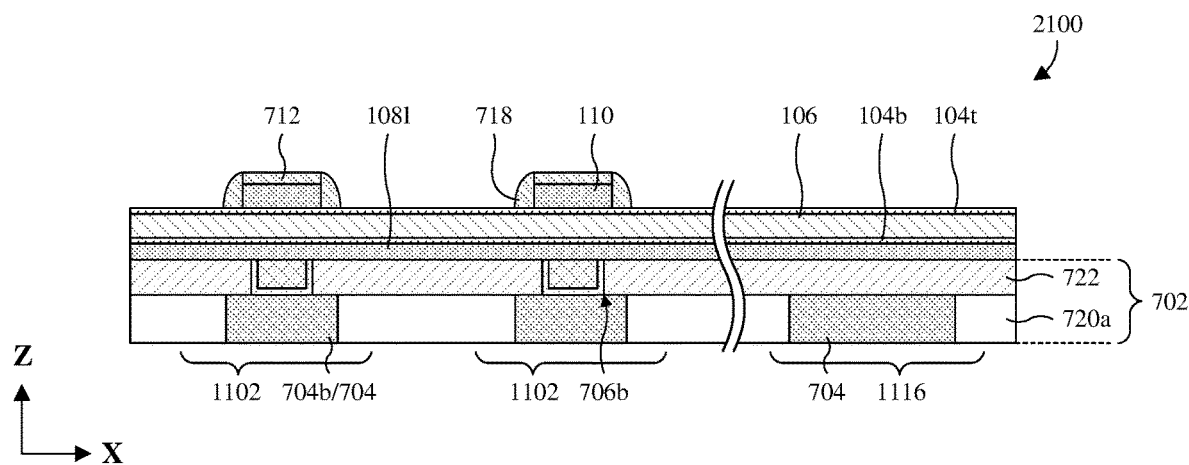

As illustrated by the cross-sectional view 2100 of FIG. 21, a sidewall spacer structure 718 is formed on common sidewalls formed by the hard masks 712 and the top electrodes 110. A process for forming the sidewall spacer structure 718 may, for example, comprise: 1) depositing a sidewall spacer layer; and 2) etching back the sidewall spacer layer. Other suitable processes are, however, amenable. The sidewall spacer layer may, for example, be deposited by CVD, PVD, ALD, some other suitable deposition process(es), or any combination of the foregoing.

Figure 22:
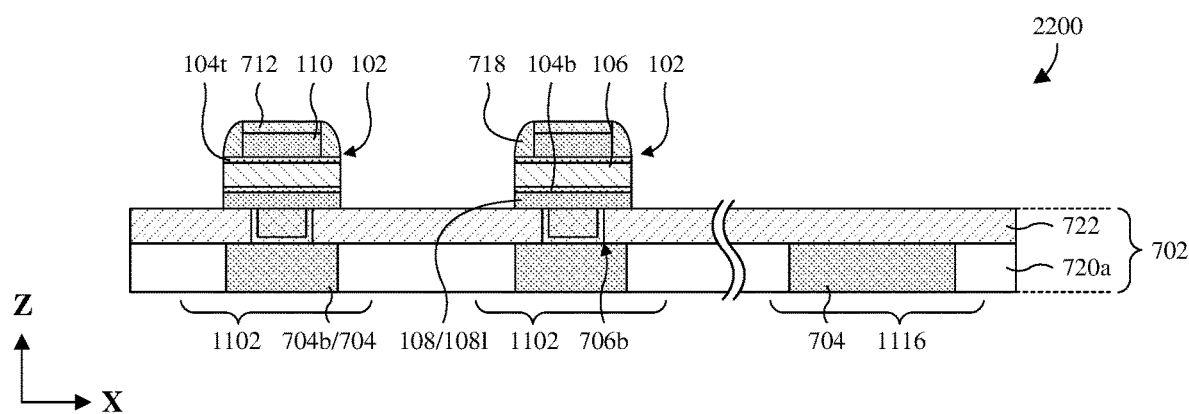

As illustrated by the cross-sectional view 2200 of FIG. 22, a second etch is performed into the top and bottom interfacial layers 104t, 104b, the ferroelectric layer 106, and the bottom electrode layer 1081 with the sidewall spacer structures 718 and the hard masks 712 in place. The second etch stops on the first etch stop layer 722. Further, the second etch transfers patterns of the hard masks 712 and the sidewall spacer structures 718 to the bottom electrode layer 1081, the top and bottom interfacial layers 104t, 104b, and the ferroelectric layer 106, thereby segmenting the aforementioned layers. The segments of the bottom electrode layer 1081 are individual to and respectively at the 1T1C cells 1102 being formed and are hereafter referred to as bottom electrodes 108. The bottom and top electrodes 108, 110, segments of the bottom and top interfacial layers 104b, 104t, and segments of the ferroelectric layer 106 form memory cells 102 respectively at the 1T1C cells 1102 being formed.

As illustrated by the cross-sectional views 2300-2600 of FIGS. 23-26, the interconnect structure 702 is completed over and around the memory cells 102.

Figure 23:
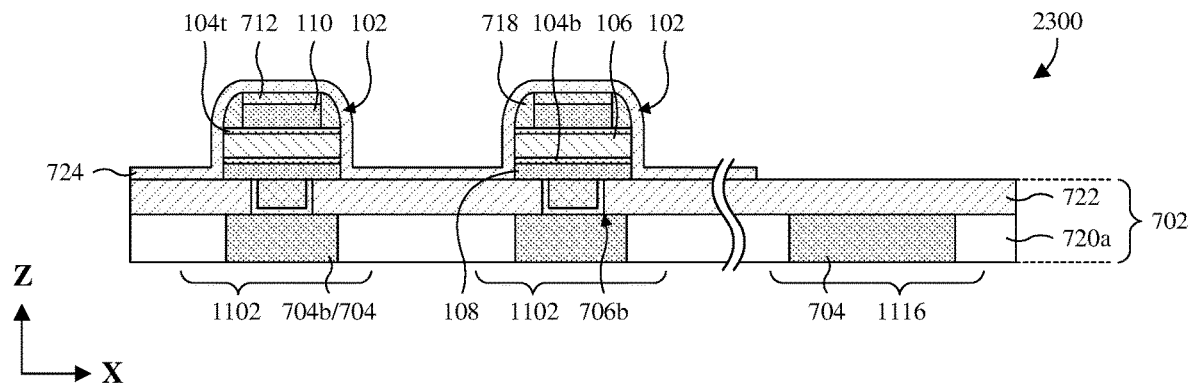

As illustrated by the cross-sectional view 2300 of FIG. 23, a second etch stop layer 724 is formed covering the memory cells 102 and laterally offset from the peripheral region 1116. A process for forming the second etch stop layer 724 as such may, for example, comprise: 1) depositing the second etch stop layer 724 covering the memory cells 102 and the peripheral region 1116; and 2) patterning the second etch stop layer 724 to remove it from the peripheral region 1116. Other suitable processes are, however, amenable. The second etch stop layer 724 may, for example, be deposited by CVD, PVD, ALD, some other suitable deposition process(es), or any combination of the foregoing. The patterning may, for example, be performed by a photolithography/etching process or some other suitable process.

Figure 24:
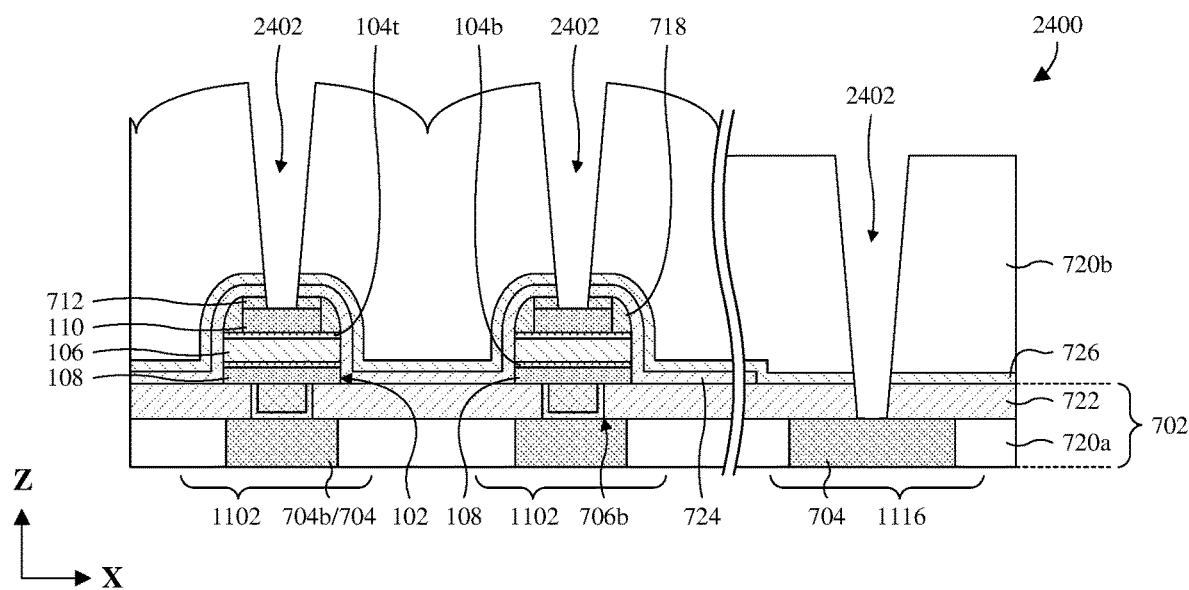

As illustrated by the cross-sectional view 2400 of FIG. 24, a buffer layer 726 and a second IMD layer 720b are deposited covering the memory cells and the peripheral region 1116 over the first and second etch stop layers 722, 724. In alternative embodiments, the buffer layer 726 is omitted. The buffer layer 726 and/or the second IMD layer 720*b* may, for example, be deposited by CVD, PVD, ALD, some other suitable deposition process(es), or any combination of the foregoing.

Also illustrated by the cross-sectional view 2400 of FIG. 24, the second IMD layer 720*b*, the buffer layer 726, and the first and second etch stop layers 722, 724 are patterned to form a plurality of via opening 2402. The via openings 2402 respectively expose the top electrodes 110 at the memory cells 102 and a wire 704 at the peripheral region 1116. The patterning may, for example, be performed by one or more photolithography/etching process(es) and/or some other suitable patterning process(es).

Figure 25:
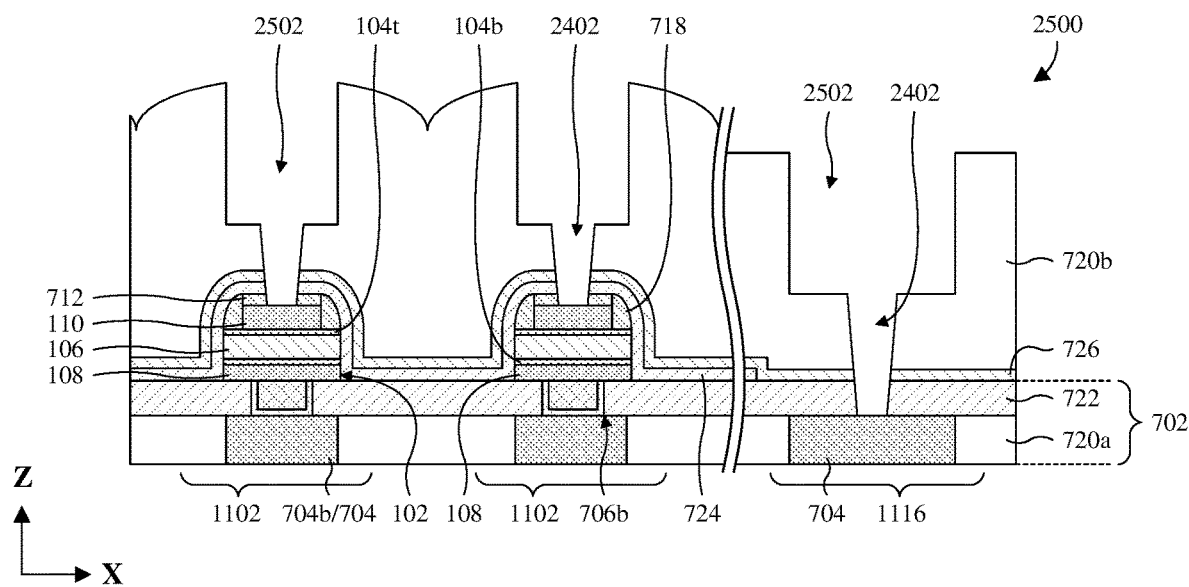

As illustrated by the cross-sectional view 2500 of FIG. 25, the second IMD layer 720*b* is further patterned to form a plurality of wire opening 2502 overlapping with the via openings 2402. The patterning may, for example, be performed by a photolithography/etching process and/or some other suitable patterning process(es).

Figure 26:
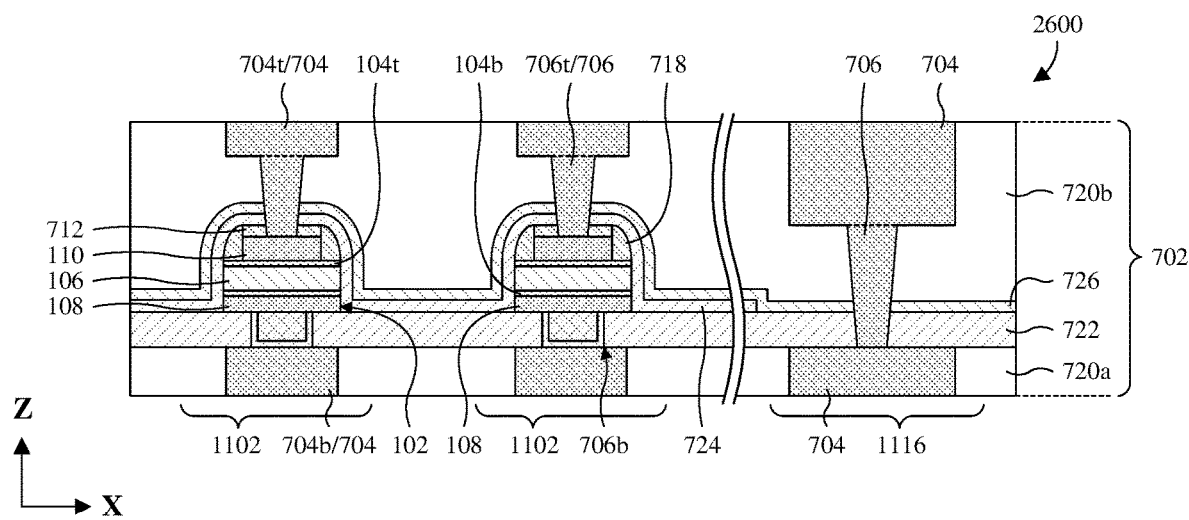

As illustrated by the cross-sectional view 2600 of FIG. 26, a plurality of additional wires 704 and a plurality of additional vias 706 are formed filling the via openings 2402 (see, e.g., FIG. 24) and the wire openings 2502 (see, e.g., FIG. 25). The plurality of additional wires 704 respectively fill the wire openings 2502 and comprise a plurality of top electrode wires 704*t* individual to and respectively overlying the memory cells 102. The plurality of additional vias 706 respectively fill the via openings 2402 and comprise a plurality of TEVAs 706*t* individual to and respectively at the top electrodes 110. Further, the TEVAs 706*t* extend respectively from the top electrode wires 704*t* respectively to the top electrodes 110.

A process for forming the additional wires 704 and the additional vias 706 may, for example, comprise: 1) depositing a metal layer filling the via openings 2402 and the wire openings 2502; and 2) performing a planarization into the metal layer and the second IMD layer 720*b* until top surfaces of the second IMD layer 720*b* and the metal layer are level with each other. Other suitable processes are, however, amenable. The metal layer may, for example, be deposited by CVD, PVD, ALD, electroless plating, electroplating, some other suitable deposition process(es), or any combination of the foregoing.

While FIGS. 14-26 are described with reference to a method, it will be appreciated that the structures shown in FIGS. 14-26 are not limited to the method but rather may stand alone separate of the method. While FIGS. 14-26 are described as a series of acts, it will be appreciated that the order of the acts may be altered in other embodiments. While FIGS. 14-26 illustrate and describe as a specific set of acts, some acts that are illustrated and/or described may be omitted in other embodiments. Further, acts that are not illustrated and/or described may be included in other embodiments.

Figure 27:
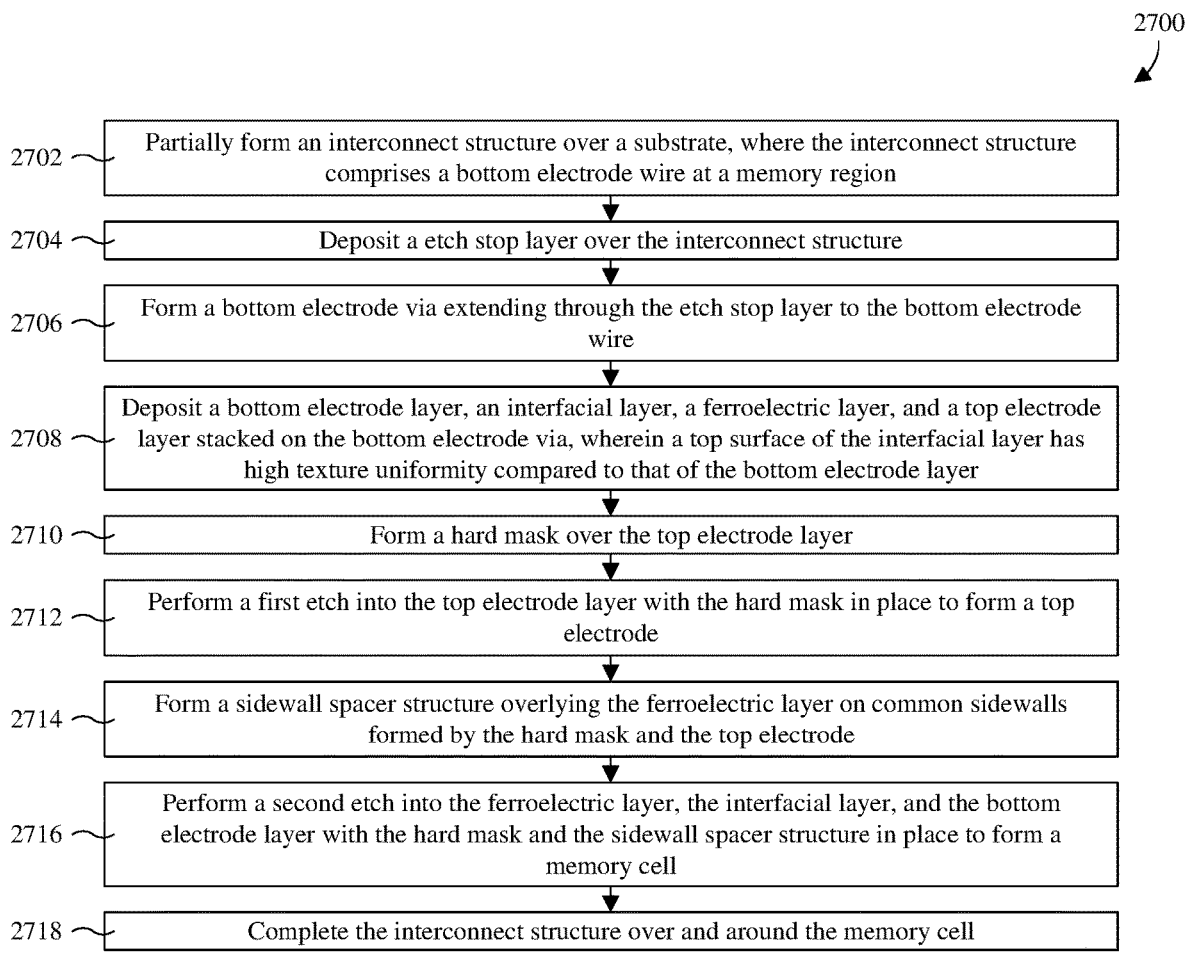
FIG. 27 illustrates a block diagram of some embodiments of the method of FIGS. 14-26.

With reference to FIG. 27, a block diagram 2700 of some embodiments of the method of FIGS. 14-26 is provided At 2702, an interconnect structure is partially formed over a substrate, where the interconnect structure comprises a bottom electrode wire at a memory region. See, for example, FIG. 14.

At 2704, an etch stop layer is deposited over the interconnect structure. See, for example, FIG. 15.

At 2706, a bottom electrode via is formed extending through the etch stop layer to the bottom electrode wire. See, for example, FIG. 15.

At 2708, a bottom electrode layer, an interfacial layer, a ferroelectric layer, and a top electrode layer are deposited stacked on the bottom electrode via, wherein a top surface of the interfacial layer has high texture uniformity compared to that of the bottom electrode layer. See, for example, FIGS. 16-19.

At 2710, a hard mask is formed over the top electrode layer. See, for example, FIGS. 19 and 20.

At 2712, a first etch is performed into the top electrode layer with the hard mask in place to form a top electrode. See, for example, FIG. 20.

At 2714, a sidewall spacer structure is formed overlying the ferroelectric layer on common sidewalls formed by the hard mask and the top electrode. See, for example, FIG. 21.

At 2716, a second etch is performed into the ferroelectric layer, the interfacial layer, and the bottom electrode layer with the hard mask and the sidewall spacer structure in place to form a memory cell. See, for example, FIG. 22.

At 2718, the interconnect structure is completed over and around the memory cell. See, for example, FIGS. 23-26.

While the block diagram 2700 of FIG. 27 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 28:
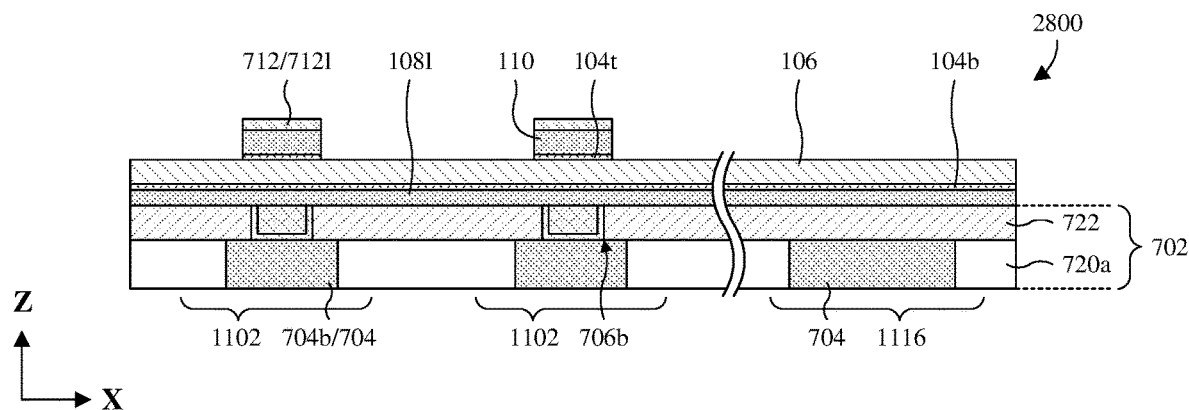
FIGS. 28 and 29 illustrate a series of cross-sectional views of some first alternative embodiments of the method of FIGS. 14-26.
Figure 29:
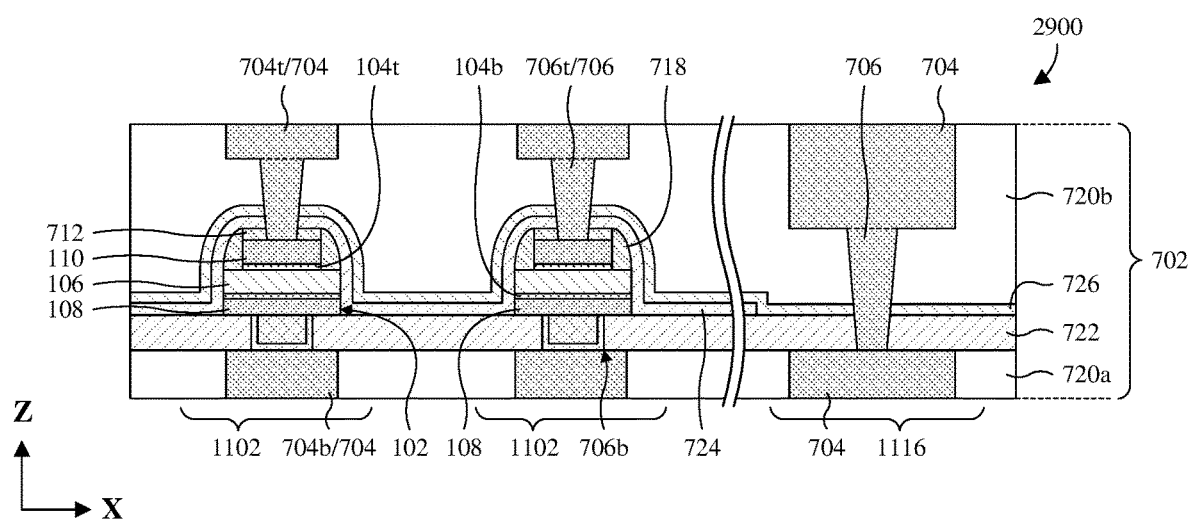

With reference to FIGS. 28 and 29, a series of cross-sectional views 2800, 2900 of some first alternative embodiments of the method of FIGS. 14-26 is provided in which the first etch extends through the top interfacial layer 104*t*. The first alternative embodiments may, for example, be performed to form the memory cells as in FIG. 10A.

As illustrated by the cross-sectional view 2800 of FIG. 28, the acts described with regard to FIGS. 14-20 are performed as described with regard to FIGS. 14-20, except that the first etch described with regard to FIG. 20 further extends into the top interfacial layer 104*t* and stops on the ferroelectric layer 106. As such, the first etch transfers patterns of the hard masks 712 to the top electrode layer 1101 and the top interfacial layer 104*t*, thereby segmenting the top electrode layer 1101 and the top interfacial layer 104*t*. In some embodiments, the top interfacial layer 104*t* is a group 2 material, whereas the bottom interfacial layer 104*b* is a group 1 material. A group 1 material is a dielectric or metal oxide that is amorphous or crystalline as described with regard to FIG. 17. Further, a group 2 material is conductive and is a metal that is amorphous or crystalline as described with regard to FIG. 17.

As illustrated by the cross-sectional view 2900 of FIG. 29, the acts described with regard to FIGS. 21-26 are performed as described with regard to FIGS. 21-26.

While FIGS. 28 and 29 are described with reference to a method, it will be appreciated that the structures shown in FIGS. 28 and 29 are not limited to the method but rather may stand alone separate of the method. While FIGS. 28 and 29 are described as a series of acts, it will be appreciated that the order of the acts may be altered in other embodiments. While FIGS. 28 and 29 illustrate and describe as a specific set of acts, some acts that are illustrated and/or described may be omitted in other embodiments. Further, acts that are not illustrated and/or described may be included in other embodiments.

Figure 30:
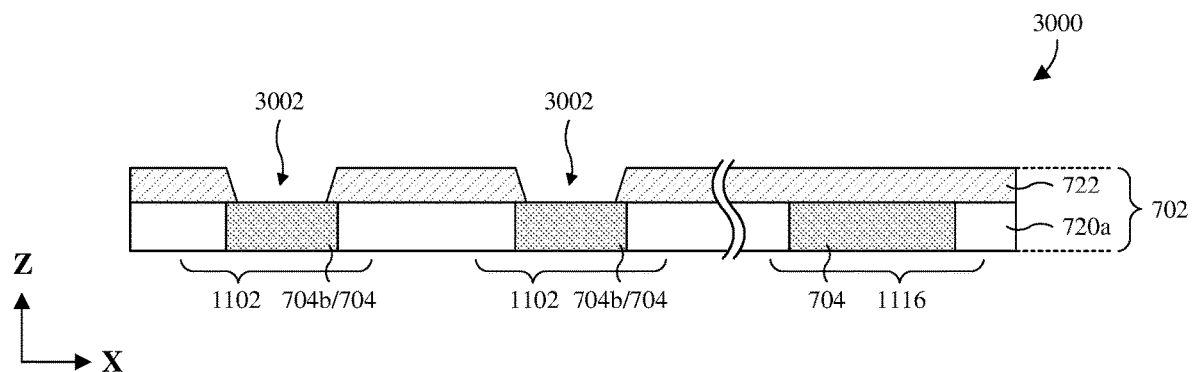
FIGS. 30-32 illustrate a series of cross-sectional views of some second alternative embodiments of the method of FIGS. 14-26.
Figure 31:
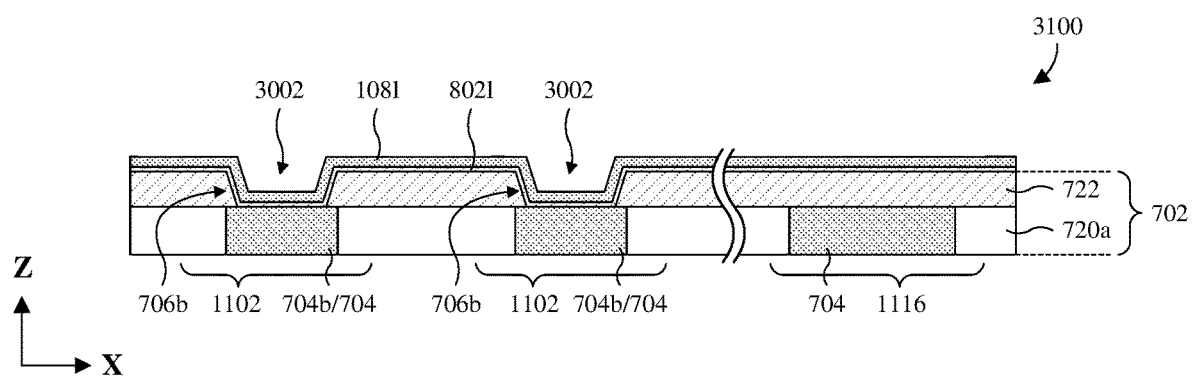
Figure 32:
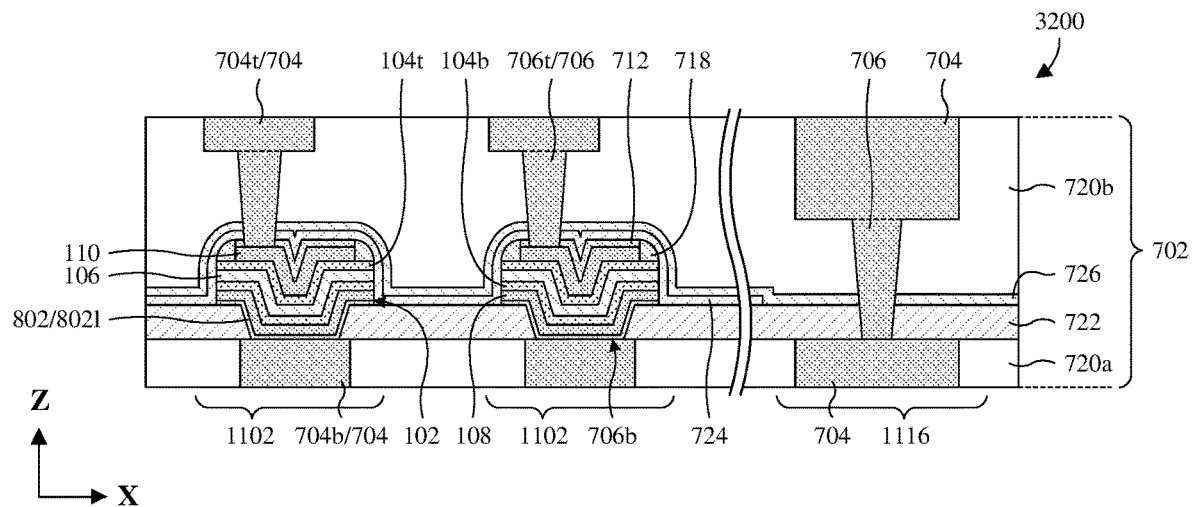

With reference to FIGS. 30-32, a series of cross-sectional views 3000-3200 of some second alternative embodiments of the method of FIGS. 14-26 is provided in which the bottom electrodes 108 and bottom electrode barriers 802 form the BEVAs 706b. The second alternative embodiments may, for example, be performed to form the memory cells as in FIG. 10B.

As illustrated by the cross-sectional view 3000 of FIG. 30, the acts described with regard to FIG. 14 are performed. Further, a first etch stop layer 722 is deposited on the interconnect structure 702 and is subsequently patterned to form BEVA openings 3002 exposing the bottom electrode wires 704b. The first etch stop layer 722 is a dielectric and may, for example, be deposited by CVD, PVD, ALD, some other suitable deposition process(es), or any combination of the foregoing. The patterning may, for example, be performed by a photolithography/etching process or some other suitable patterning process.

As illustrated by the cross-sectional view 3100 of FIG. 31, a bottom electrode barrier layer 8021 and a bottom electrode layer 1081 are deposited over the first etch stop layer 722 and lining the BEVA openings 3002, thereby forming BEVAs 706b. The bottom electrode layer 1081 is conductive and may, for example, be or comprise titanium nitride, tantalum nitride, ruthenium, platinum, iridium, molybdenum, tungsten, doped polysilicon, some other suitable conductive material(s), or any combination of the foregoing. The bottom electrode barrier layer 8021 is conductive and may, for example, be or comprise titanium nitride, platinum, aluminum copper, gold, titanium, tantalum, tantalum nitride, tungsten, tungsten nitride, some other suitable conductive material(s), or any combination of the foregoing. The bottom electrode layer 1081 and/or the bottom electrode barrier layer 8021 may, for example, be deposited by CVD, PVD, ALD, some other suitable deposition process(es), or any combination of the foregoing.

As illustrated by the cross-sectional view 3200 of FIG. 32, the acts described with regard to FIGS. 17-26 are performed as described with regard to FIGS. 17-26, except that the second etch described with regard to FIG. 22 also extends into the bottom electrode barrier layer 8021 to segment the bottom electrode barrier layer 8021 into bottom electrode barriers 802 individual to the bottom electrodes 108. In some embodiments, the top interfacial layer 104t is a group 1 material, whereas the bottom interfacial layer 104b is a group 1 or 2 material.

In alternative embodiments, the first etch described with regard to FIG. 20 extends into the top interfacial layer 104t as in FIG. 28. Such alternative embodiments may, for example, form the memory cells 102 as in FIG. 10C. In at least some of such embodiments, the top interfacial layer 104t is a group 2 material, whereas the bottom interfacial layer 104b is a group 1 or 2 material. Further, in alternative embodiments, the top interfacial layer 104t is omitted. Such alternative embodiments may, for example, form the memory cells 102 as in FIG. 8A.

While FIGS. 30-32 are described with reference to a method, it will be appreciated that the structures shown in FIGS. 30-32 are not limited to the method but rather may stand alone separate of the method. While FIGS. 30-32 are described as a series of acts, it will be appreciated that the order of the acts may be altered in other embodiments. While FIGS. 30-32 illustrate and describe as a specific set of acts, some acts that are illustrated and/or described may be omitted in other embodiments. Further, acts that are not illustrated and/or described may be included in other embodiments.

Figure 33:
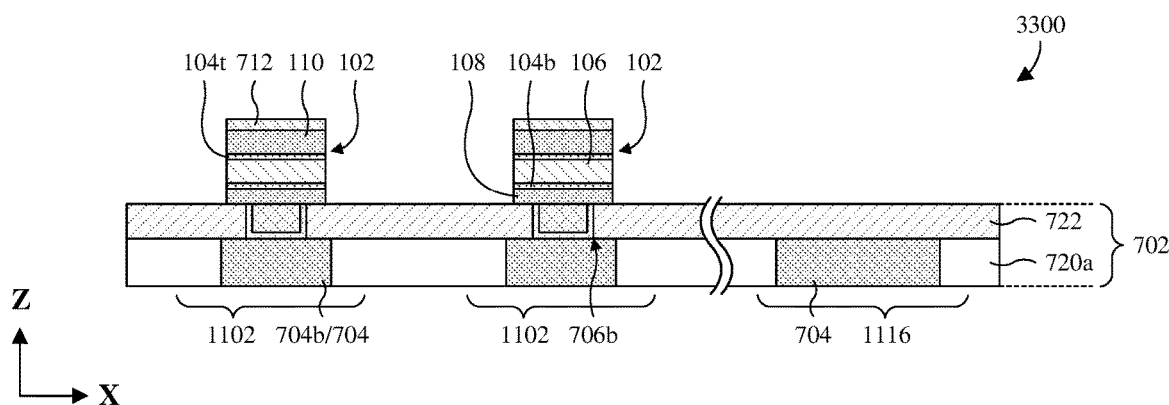
FIGS. 33-35 illustrate a series of cross-sectional views of some third alternative embodiments of the method of FIGS. 14-26.
Figure 34:
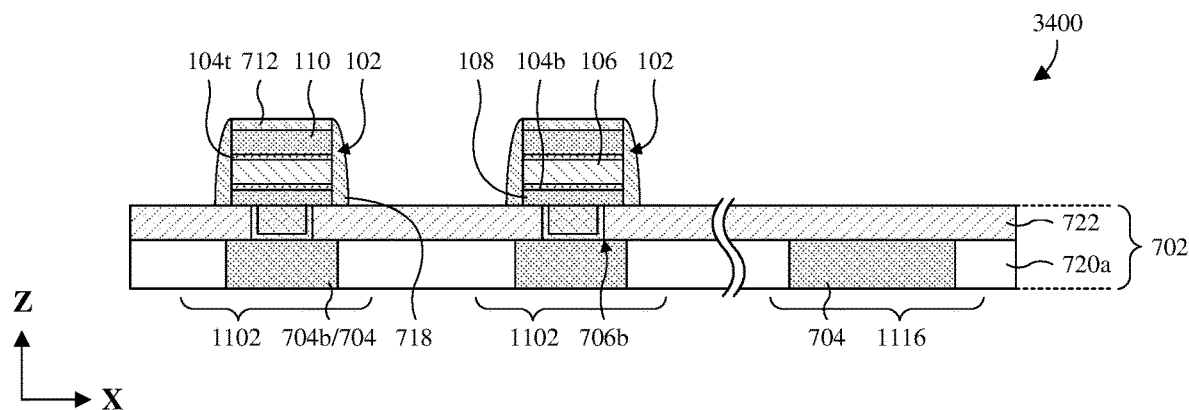
Figure 35:
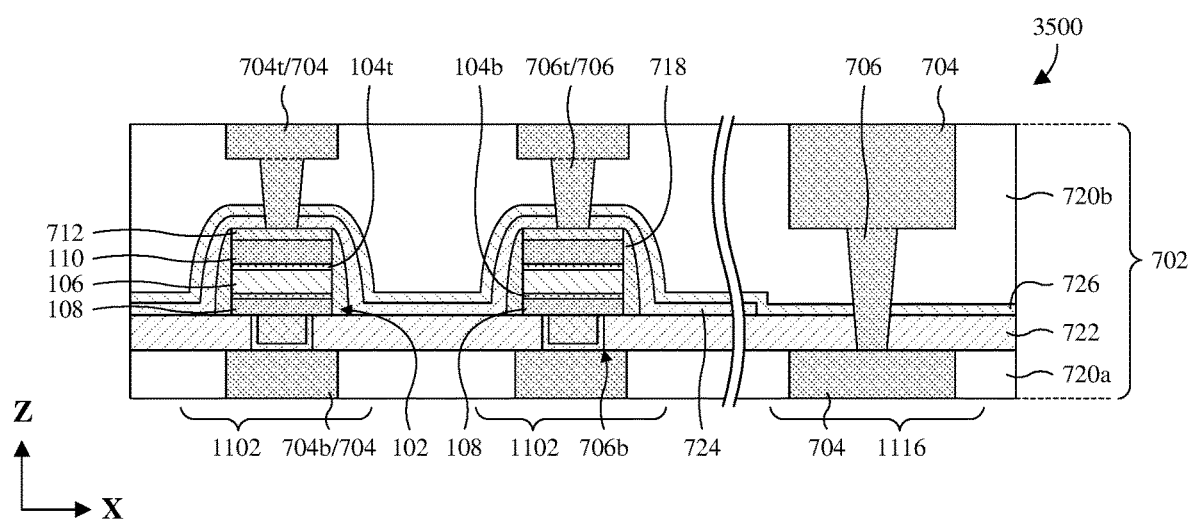

With reference to FIGS. 33-35, a series of cross-sectional views 3300-3500 of some third alternative embodiments of the method of FIGS. 14-26 is provided in which the second etch is omitted. The third alternative embodiments may, for example, be performed to form the memory cells as in FIG. 10E.

As illustrated by the cross-sectional view 3300 of FIG. 33, the acts described with regard to FIGS. 14-19 are performed as described with regard to FIGS. 14-19. In alternative embodiments, the top interfacial layer 104t is omitted. Such alternative embodiments may, for example, form the memory cells 102 as in FIG. 8C. Further, the first etch described with regard to FIG. 20 is performed as described with regard to FIG. 20, except that the first etch further extends through the top interfacial layer 104t, the ferroelectric layer 106, the bottom interfacial layer 104b, and the bottom electrode layer 1081 to form the memory cells 102.

As illustrated by the cross-sectional view 3400 of FIG. 34, a sidewall spacer structure 718 is formed on common sidewalls formed by the hard masks 712, the bottom and top electrodes 108, 110, the bottom and top interfacial layers 104b, 104t, and the ferroelectric layer 106. The sidewall spacer structure 718 may, for example, be formed as described with regard to FIG. 21 or according to some other suitable process.

As illustrated by the cross-sectional view 3500 of FIG. 35, the acts described with regard to FIGS. 23-26 are performed as described with regard to FIGS. 23-26.

While FIGS. 33-35 are described with reference to a method, it will be appreciated that the structures shown in FIGS. 33-35 are not limited to the method but rather may stand alone separate of the method. While FIGS. 33-35 are described as a series of acts, it will be appreciated that the order of the acts may be altered in other embodiments. While FIGS. 33-35 illustrate and describe as a specific set of acts, some acts that are illustrated and/or described may be omitted in other embodiments. Further, acts that are not illustrated and/or described may be included in other embodiments.

With reference to FIGS. 36-40, a series of cross-sectional views 3600-4000 of some fourth alternative embodiments of the method of FIGS. 14-26 is provided in which the first and second etches are omitted. The fourth alternative embodiments may, for example, be performed to form the memory cells as in FIG. 10D.

Figure 36:
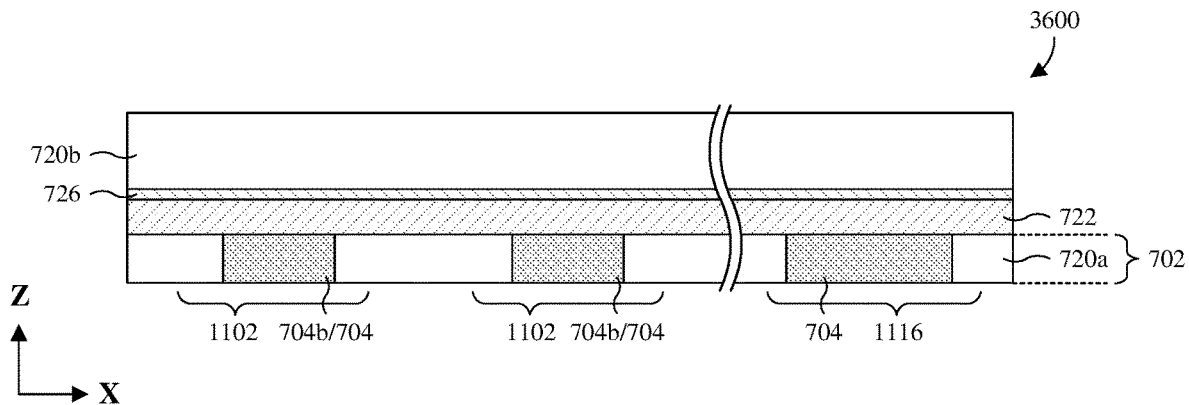
FIGS. 36-40 illustrate a series of cross-sectional views of some fourth alternative embodiments of the method of FIGS. 14-26.

As illustrated by the cross-sectional view 3600 of FIG. 36, the acts described with regard to FIG. 14 are performed as described with regard to FIG. 14. Further, a first etch stop layer 722, a buffer layer 726, and a second IMD layer 720b are deposited stacked over the interconnect structure 702, such that the buffer layer 726 is between the first etch stop layer 722 and the second IMD layer 720b. In alternative embodiments, the buffer layer 726 is omitted. The first etch stop layer 722, the buffer layer 726, and the second IMD layer 720b may, for example, be deposited by CVD, PVD, ALD, some other suitable deposition process(es), or any combination of the foregoing.

Figure 37:
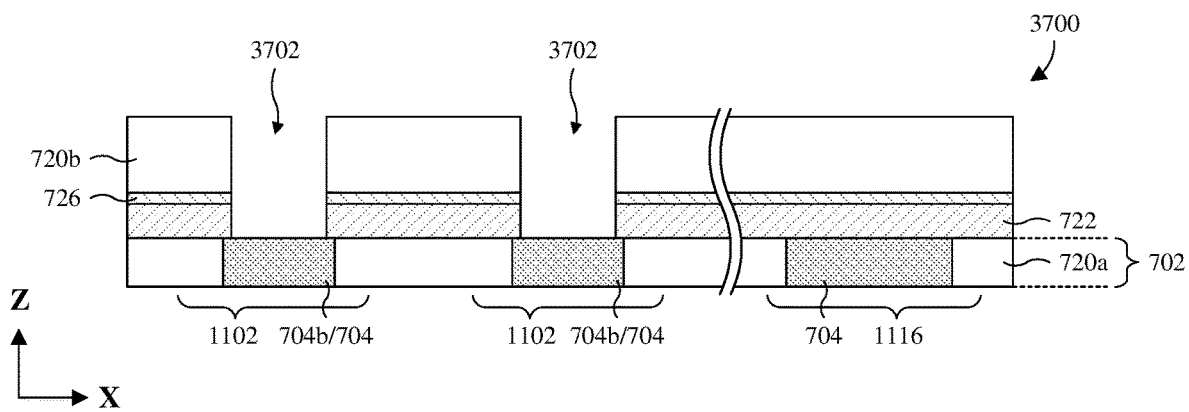

As illustrated by the cross-sectional view 3700 of FIG. 37, the first etch stop layer 722, the buffer layer 726, and the second IMD layer 720b are patterned to form cell openings 3702 respectively exposing the bottom electrode wires 704b. The patterning may, for example, be performed by a photolithography/etching process or some other suitable patterning process.

Figure 38:
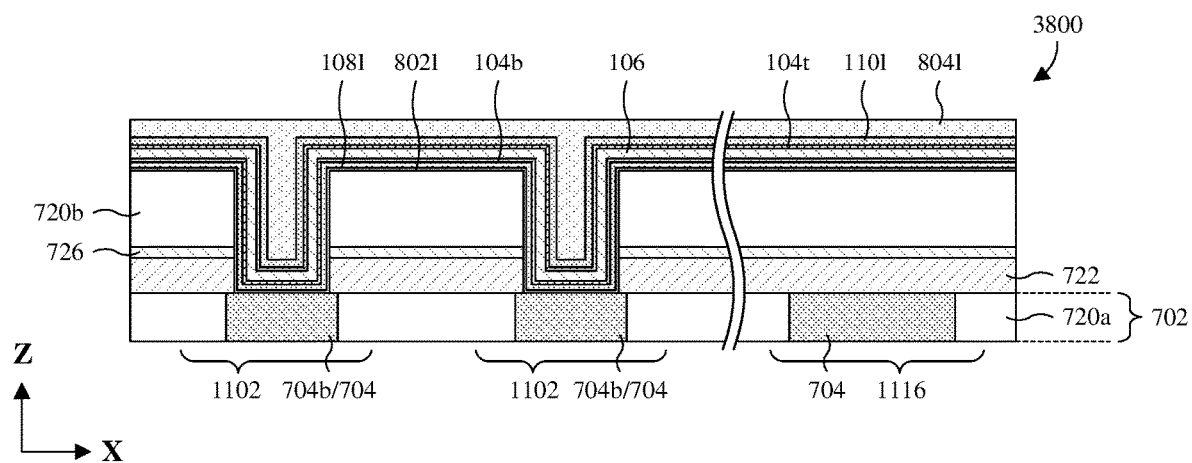

As illustrated by the cross-sectional view 3800 of FIG. 38, a bottom electrode barrier layer 8021 is deposited over the second IMD layer 720b and lining the cell openings 3702. The acts described with regard to FIGS. 16-19 are then performed as described with regard to FIGS. 16-19 to deposit a bottom electrode layer 1081, a bottom interfacial layer 104b, a ferroelectric layer 106, a top interfacial layer 104t, and a top electrode layer 1101. Further, a top electrode barrier layer 8041 is deposited over the top electrode layer 1101. The aforementioned layers or any combination of the aforementioned layers may, for example, be deposited by CVD, PVD, ALD, some other suitable deposition process (es), or any combination of the foregoing. In alternative embodiments, the top interfacial layer 104t is omitted to form the memory cells as in FIG. 8B.

Figure 39:
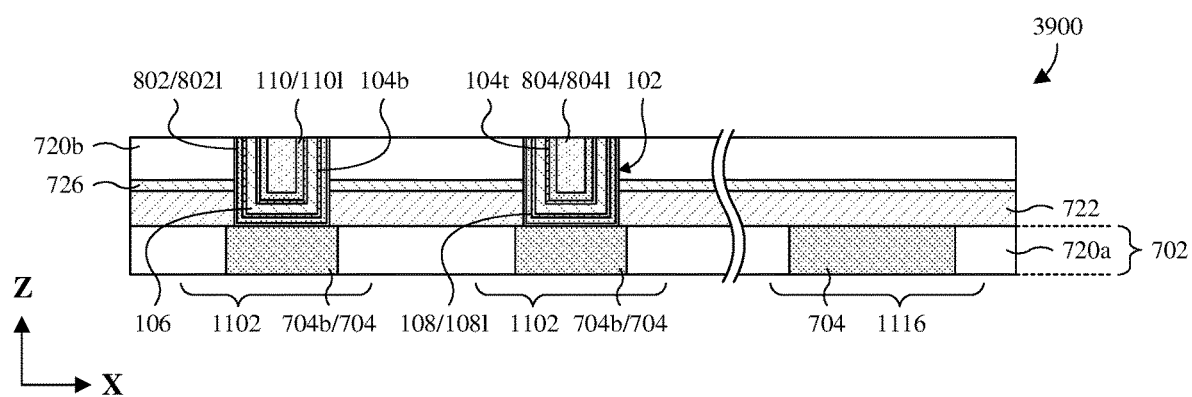

As illustrated by the cross-sectional view 3900 of FIG. 39, a planarization is performed into the bottom electrode layer 1081, the bottom interfacial layer 104b, the ferroelectric layer 106, the top interfacial layer 104t, the top electrode layer 1101, the bottom electrode barrier layer 8021, and the top electrode barrier layer 8041 until top surfaces thereof are level with a top surface of the second IMD layer 720b. This segments the aforementioned layers to form memory cells 102. Segments of the bottom and top electrode barrier layers 8021, 8041 are hereafter and respectively referred to as bottom electrode barriers 802 and top electrodes barriers 804. Similarly, segments of the bottom and top electrode layers 1081, 1101 are hereafter and respectively referred to as bottom electrodes 108 and top electrodes 110. The planarization may, for example, be performed by a chemical mechanical polish (CMP) and/or some other suitable planarization.

Figure 40:
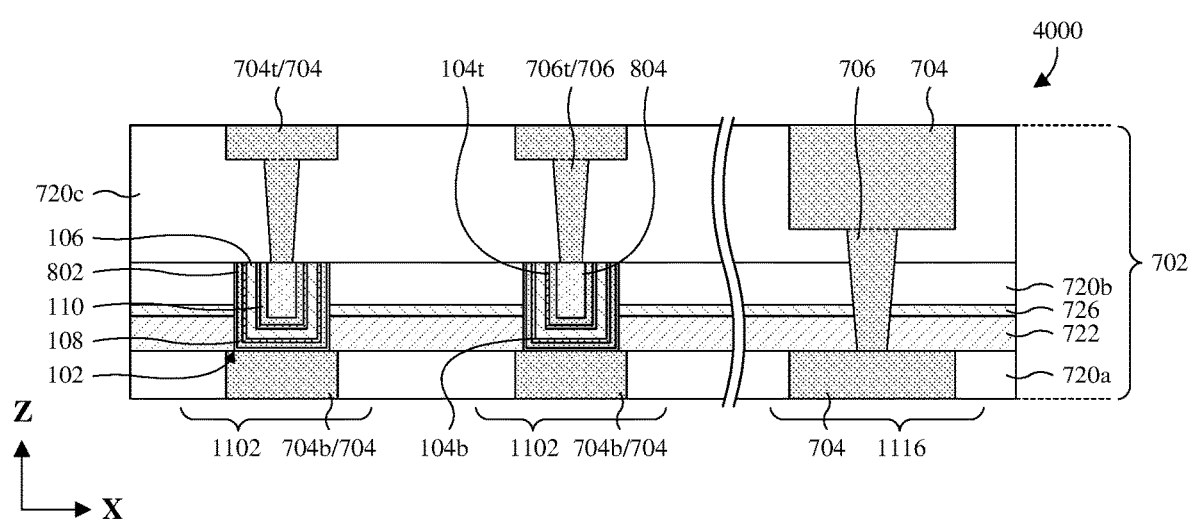

As illustrated by the cross-sectional view 4000 of FIG. 40, the acts described with regard to FIGS. 24-26 are performed as described with regard to FIGS. 24-26, except that the acts deposit a third IMD layer 720c instead of the second IMD layer 720b and thereafter pattern the second and third IMD layers 720b, 720c.

While FIGS. 36-40 are described with reference to a method, it will be appreciated that the structures shown in FIGS. 36-40 are not limited to the method but rather may stand alone separate of the method. While FIGS. 36-40 are described as a series of acts, it will be appreciated that the order of the acts may be altered in other embodiments. While FIGS. 36-40 illustrate and describe as a specific set of acts, some acts that are illustrated and/or described may be omitted in other embodiments. Further, acts that are not illustrated and/or described may be included in other embodiments.

In some embodiments, the present disclosure an IC chip including a memory cell, wherein the memory cell includes: a bottom electrode; a ferroelectric layer overlying the bottom electrode; a top electrode overlying the ferroelectric layer; and a first interfacial layer between the ferroelectric layer and the bottom electrode, wherein a top surface of the first interfacial layer has higher texture uniformity than a top surface of the bottom electrode to enhance remanent polarization of the ferroelectric layer. In some embodiments, the first interfacial layer is a monocrystalline dielectric, metal oxide, or metal. In some embodiments, the first interfacial layer is a crystalline dielectric, metal, or metal oxide with at least 90% of grains sharing a common orientation. In some embodiments, the first interfacial layer has a crystallization temperature above about 400 degrees Celsius. In some embodiments, the first interfacial layer is a crystalline dielectric, metal, or metal oxide with at least 90% of grains having a grain size less than about 1 nanometer. In some embodiments, the first interfacial layer is an amorphous dielectric, metal, or metal oxide. In some embodiments, the memory cell further includes: a second interfacial layer between the top electrode and the ferroelectric layer, wherein the second interfacial layer has a higher energy bandgap than the ferroelectric layer. In some embodiments, the second interfacial layer is a same material as the first interfacial layer. In some embodiments, the first interfacial layer is a dielectric or metal oxide, and the second interfacial layer is a metal, or vice versa.

In some embodiments, the present disclosure provides another IC chip including a memory cell, wherein the memory cell includes: a bottom electrode; a ferroelectric layer overlying the bottom electrode; a top electrode overlying the ferroelectric layer; and a first interfacial layer between and directly contacting the ferroelectric layer and the bottom electrode, wherein the first interfacial layer is an amorphous material, a monocrystalline material, or a crystalline material in which a majority of grains in the first interfacial layer share a common orientation and/or have a grain size less than about 1 nanometer. In some embodiments, the top electrode directly contacts the ferroelectric layer. In some embodiments, the IC chip further includes: a second interfacial layer between and directly contacting the ferroelectric layer and the top electrode, wherein the second interfacial layer is an amorphous or crystalline material different than that of the ferroelectric layer. In some embodiments, the first interfacial layer has a higher energy bandgap than the ferroelectric layer. In some embodiments, the bottom electrode, the ferroelectric layer, the top electrode, and the first interfacial layer form a common sidewall. In some embodiments, the bottom electrode, the ferroelectric layer, the top electrode, and the first interfacial layer form a common sidewall laterally offset from a sidewall of the top electrode, and wherein IC chip further includes: a sidewall spacer overlying the ferroelectric layer and extending from the common sidewall to the sidewall of the top electrode. In some embodiments, the bottom electrode, the ferroelectric layer, and the first interfacial layer have individual U-shaped profiles with top surfaces that are level with each other. In some embodiments, the IC chip further includes a conductive wire underlying the memory cell, wherein the memory cell forms a BEVA protruding downward to the conductive wire, and wherein the bottom electrode, the ferroelectric layer, the first interfacial layer, and the top electrode have individual top surfaces that are indented at the BEVA.

In some embodiments, the present disclosure provides a method including: depositing a bottom electrode layer over a substrate; depositing a first interfacial layer overlying the bottom electrode layer; depositing a ferroelectric layer overlying and directly on the first interfacial layer; depositing a top electrode layer overlying the ferroelectric layer; and patterning the bottom and top electrode layers, the first interfacial layer, and the ferroelectric layer to form a memory cell; wherein a top surface of the first interfacial layer has greater texture uniformity than a top surface of the bottom electrode layer. In some embodiments, the first interfacial layer is an amorphous dielectric, metal, or metal oxide, and wherein the bottom electrode layer is crystalline. In some embodiments, the first interfacial layer and the bottom electrode layer are crystalline, and wherein the first interfacial layer has a higher percentage of grains with a grain size less than about 1 nanometer than the bottom electrode layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
depositing a bottom electrode layer over a substrate;
depositing a first interfacial layer overlying the bottom electrode layer;
depositing a ferroelectric layer overlying and directly on the first interfacial layer;
depositing a top electrode layer overlying the ferroelectric layer;
performing a first etch into the top electrode layer to form a top electrode;
performing a second etch into the ferroelectric layer, the first interfacial layer, and the bottom electrode layer; and
forming a sidewall spacer structure on a sidewall of the top electrode between the first etch and the second etch;
wherein a top surface of the first interfacial layer has greater texture uniformity than a top surface of the bottom electrode layer.

2. The method according to claim 1, wherein the first interfacial layer is an amorphous dielectric, metal, or metal oxide, and wherein the bottom electrode layer is crystalline.

3. The method according to claim 1, wherein the first interfacial layer and the bottom electrode layer are crystalline, and wherein the first interfacial layer has a higher percentage of grains with a grain size less than about 1 nanometer than the bottom electrode layer.

4. The method according to claim 1, wherein the first interfacial layer is a crystalline dielectric, metal, or metal oxide with at least 90% of grains sharing a common orientation.

5. The method according to claim 1, wherein the ferroelectric layer is deposited with an energy bandgap smaller than an energy bandgap of the first interfacial layer.

6. A method comprising:
forming a bottom electrode layer over a substrate;
forming a first interfacial layer overlying and directly on the bottom electrode layer;
forming a ferroelectric layer overlying and directly on the first interfacial layer;
forming a second interfacial layer overlying the ferroelectric layer;
forming a top electrode layer overlying the second interfacial layer;
performing a first etch into the top electrode layer to form a top electrode;
forming a sidewall spacer structure overlying the second interfacial layer, on a sidewall of the top electrode; and
performing a second etch into the second interfacial layer after the forming of the sidewall spacer structure.

7. The method according to claim 6, wherein a top surface of the first interfacial layer has an average surface roughness less than an average surface roughness at a top surface of the bottom electrode layer.

8. The method of claim 6, wherein the second interfacial layer is a same material as the first interfacial layer.

9. The method according to claim 6, wherein the second etch is further performed into the ferroelectric layer, the first interfacial layer, and the bottom electrode layer after the forming of the sidewall spacer structure.

10. The method according to claim 6, wherein the second interfacial layer directly contacts the ferroelectric layer and the top electrode layer.

11. The method of claim 10, wherein the first interfacial layer is conductive and the second interfacial layer is a dielectric.

12. The method according to claim 6, wherein the first interfacial layer is amorphous.

13. A method comprising:
depositing a bottom electrode layer over a substrate;
depositing a first interfacial layer overlying and directly on the bottom electrode layer;
depositing a ferroelectric layer overlying and directly on the first interfacial layer;
depositing a top electrode layer overlying the ferroelectric layer; and
patterning the bottom and top electrode layers, the first interfacial layer, and the ferroelectric layer to form a memory cell;
wherein the first interfacial layer is crystalline with a high percentage of grains having a grain size less than 1 nanometer and a common orientation, and wherein the high percentage is at least 90%.

14. The method according to claim 13, wherein the common orientation is a (111) grain orientation.

15. The method according to claim 13, wherein the first interfacial layer is monocrystalline.

16. The method according to claim 15, wherein the first interfacial layer has grain size variation less than 10%.

17. The method according to claim 13, wherein the first interfacial layer consists essentially of one or more metal elements.

18. The method according to claim 13, wherein the first interfacial layer comprises a metal oxide.

19. The method according to claim 13, wherein the first interfacial layer has a crystallization temperature above about 400 degrees Celsius.

20. The method according to claim 1, further comprising:
forming a second interfacial layer overlying the ferroelectric layer, wherein the top electrode layer is formed overlying the second interfacial layer, and wherein the first etch is performed into the second interfacial layer.

* * * * *